United States Patent
Li et al.

(10) Patent No.: US 8,512,599 B2
(45) Date of Patent: *Aug. 20, 2013

(54) CARBONITRIDE BASED PHOSPHORS AND LIGHT EMITTING DEVICES USING THE SAME

(75) Inventors: Yuanqiang Li, Plainsboro, NJ (US); Yongchi Tian, Princeton Junction, NJ (US); Michael Dennis Romanelli, North Plainfield, NJ (US)

(73) Assignee: Lightscape Materials, Inc., Princeton, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/839,365

(22) Filed: Jul. 19, 2010

(65) Prior Publication Data

US 2011/0279016 A1    Nov. 17, 2011

Related U.S. Application Data

(60) Provisional application No. 61/334,967, filed on May 14, 2010, provisional application No. 61/354,992, filed on Jun. 15, 2010.

(51) Int. Cl.
   *C09K 11/08*   (2006.01)
   *C09K 11/66*   (2006.01)

(52) U.S. Cl.
   USPC ................................. 252/301.4 F

(58) Field of Classification Search
   USPC ............... 252/301.4 F, 301.4 R
   See application file for complete search history.

(56) References Cited

U.S. PATENT DOCUMENTS

| 7,138,756 B2 | 11/2006 | Gotoh et al. |
| 7,252,788 B2 | 8/2007 | Nagatomi et al. |

(Continued)

FOREIGN PATENT DOCUMENTS

JP    2008163259 A  *  7/2008

OTHER PUBLICATIONS 2008-163259A machine translation.*
STIC search results.*

*Primary Examiner* — Emily Le
*Assistant Examiner* — Lynne Edmondson
(74) *Attorney, Agent, or Firm* — Thomas S. Deibert

(57) ABSTRACT

Disclosed herein is a novel group of carbidonitride phosphors and light emitting devices which utilize these phosphors. In certain embodiments, the present invention is directed to a novel family of carbidonitride-based phosphors expressed as follows:

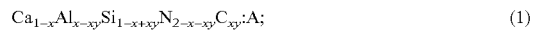

$$Ca_{1-x}Al_{x-xy}Si_{1-x+xy}N_{2-x-xy}C_{xy}:A; \quad (1)$$

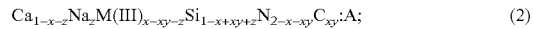

$$Ca_{1-x-z}Na_zM(III)_{x-xy-z}Si_{1-x+xy+z}N_{2-x-xy}C_{xy}:A; \quad (2)$$

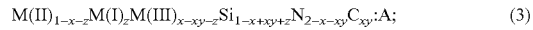

$$M(II)_{1-x-z}M(I)_zM(III)_{x-xy-z}Si_{1-x+xy+z}N_{2-x-xy}C_{xy}:A; \quad (3)$$

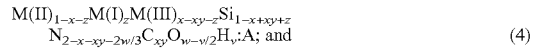

$$M(II)_{1-x-z}M(I)_zM(III)_{x-xy-z}Si_{1-x+xy+z}N_{2-x-xy-2w/3}C_{xy}O_{w-v/2}H_v:A; \text{ and} \quad (4)$$

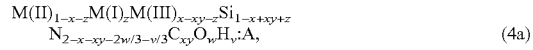

$$M(II)_{1-x-z}M(I)_zM(III)_{x-xy-z}Si_{1-x+xy+z}N_{2-x-xy-2w/3-v/3}C_{xy}O_wH_v:A, \quad (4a)$$

wherein 0<x<1, 0<y<1, 0≤z<1, 0≤v<1, 0<w<1, x+z<1, x>xy+z, and 0<x−xy−z<1, M(II) is at least one divalent cation, M(I) is at least one monovalent cation, M(III) is at least one trivalent cation, H is at least one monovalent anion, and A is a luminescence activator doped in the crystal structure.

26 Claims, 34 Drawing Sheets

(56) References Cited

U.S. PATENT DOCUMENTS

| | | |
|---|---|---|
| 7,258,816 B2 | 8/2007 | Tamaki et al. |
| 7,273,568 B2 | 9/2007 | Nagatomi et al. |
| 7,431,864 B2 * | 10/2008 | Hirosaki ............... 252/301.4 R |
| 7,902,564 B2 | 3/2011 | Mueller-Mach et al. |
| 7,964,113 B2 | 6/2011 | Tamaki et al. |
| 8,007,683 B2 | 8/2011 | Starick et al. |
| 8,105,502 B2 | 1/2012 | Fukuda et al. |
| 8,119,028 B2 | 2/2012 | Le Toquin |
| 8,148,887 B2 | 4/2012 | Hirosaki et al. |
| 8,159,126 B2 | 4/2012 | Schmidt et al. |
| 8,206,611 B2 | 6/2012 | Hirosaki et al. |
| 2007/0007494 A1 | 1/2007 | Hirosaki et al. |
| 2008/0303412 A1 * | 12/2008 | Nagatomi et al. ............ 313/503 |
| 2009/0283721 A1 * | 11/2009 | Liu et al. ................ 252/301.4 H |
| 2010/0213489 A1 | 8/2010 | Kim et al. |
| 2010/0288972 A1 | 11/2010 | Roesler et al. |
| 2011/0204769 A1 | 8/2011 | Fukuda et al. |
| 2011/0279017 A1 | 11/2011 | Li et al. |
| 2012/0062105 A1 | 3/2012 | Li et al. |

* cited by examiner

Figure 31(a)
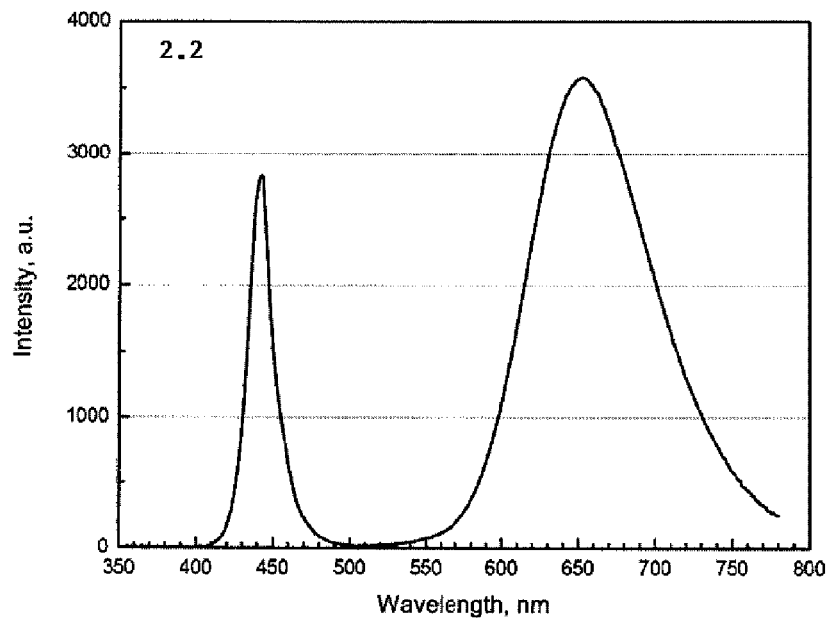
Figure 31(b)
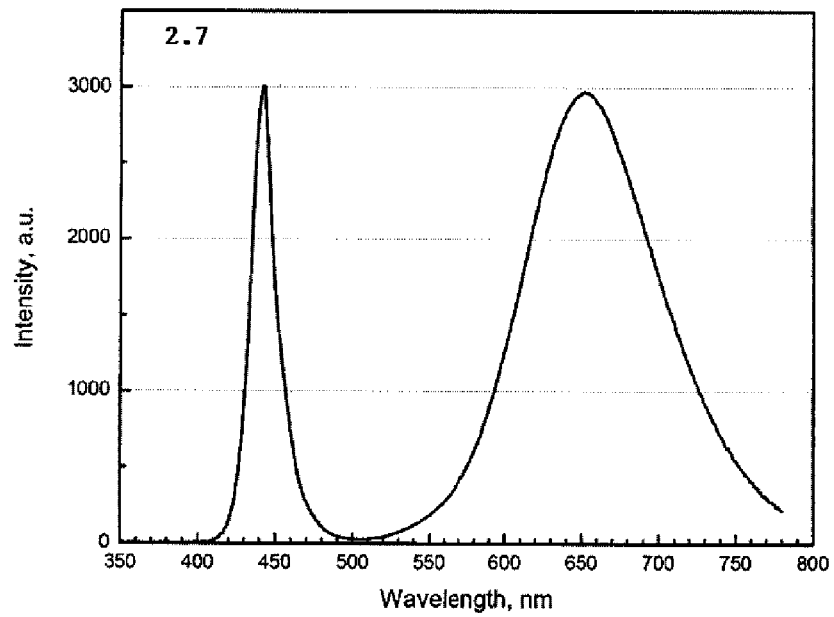
Figure 31

Figure 31(c)
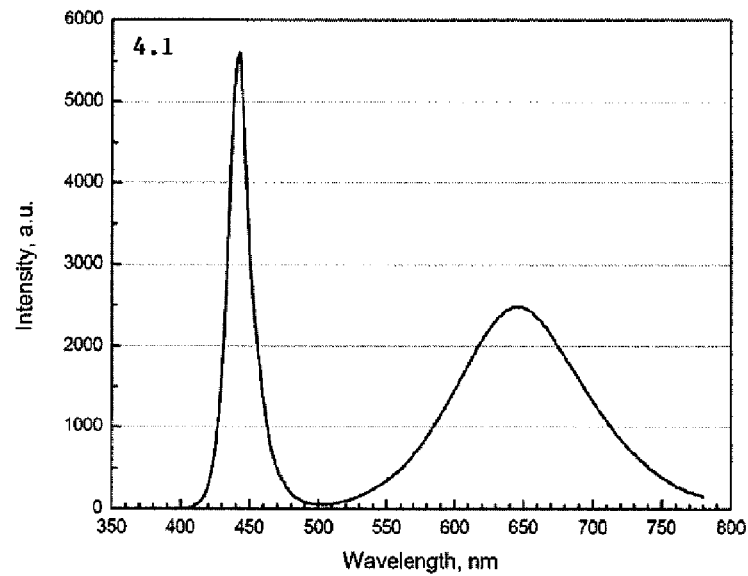
Figure 31(d)
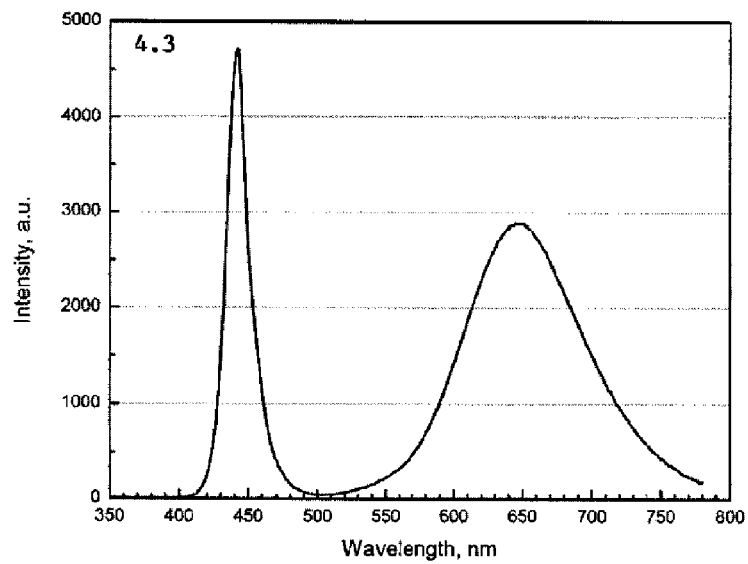
Figure 31 continued

CARBONITRIDE BASED PHOSPHORS AND LIGHT EMITTING DEVICES USING THE SAME

CLAIM OF PRIORITY

This application claims priority to U.S. Provisional Application No. 61/334,967, filed May 14, 2010, and U.S. Provisional Application No. 61/354,992, filed Jun. 15, 2010, the disclosures of which are hereby incorporated by reference in their entireties.

GOVERNMENT FUNDING

This invention was made with United States Government support under Department of Energy grant number DE-EE0003245. The United States Government may have certain rights in this invention.

STATEMENT REGARDING REFERENCES

All patents, publications, and non-patent references referred to herein shall be considered incorporated by reference into this application in their entireties.

BACKGROUND OF INVENTION

In recent years, research and development efforts have been intense on developing combinations of light sources and phosphors that will yield useful, high-performing light emitting devices, with the result that both efficient high-power light sources and efficient phosphors have been demonstrated. For example, both light emitting diode ("LED") chips and phosphors for phosphor-converted LED ("pcLED") devices have been demonstrated. A unique aspect of some phosphor/light source combinations (such as pcLEDs) is that the phosphors are in contact with the light source (such as a LED chip), and the light sources operate at high temperatures. For example, typical junction temperatures of high power LEDs are in the range of 80° C.-150° C. At these temperatures, the crystal of the phosphor is at a high vibrationally excited state, causing the LED excitation energy to be directed to heat emission through lattice relaxation rather than to the desired luminescence emission. Moreover, these lattice relaxations produce further heating, thereby further reducing the luminescence emission. This is a vicious cycle that precludes successful applications of existing phosphor materials. The pcLED lamp for general illumination application requires high optical energy flux (e.g., higher than 1 Watt/mm$^2$) which causes additional heating by a Stokes shift generated inside the phosphor crystals. Successful development of light emitting devices incorporating both phosphors and a light source, such as pcLED lamps for general illumination, therefore requires the development of phosphors that can operate highly efficiently at temperatures of 80° C.-150° C. The risk is that it is difficult both to achieve 90% quantum yield at room temperature and to have high thermal stability at 80° C.-150° C. The thermal stability of a phosphor's luminescence is an intrinsic property of the phosphor which is determined by both the composition and the structure of the crystalline material.

The use of carbon in phosphor preparations has previously been considered a source of quenching, rather than enhancing, the luminescence of a phosphor. For example, residual carbon that remains after phosphor preparation processes utilizing carbon can hinder the emission intensity of the phosphor. Further, the dark color of carbide materials naturally predisposes it to absorbing, rather than reflecting, light.

Carbidonitride phosphors are comprised of carbon, nitrogen, silicon, aluminum and/or other metals in the host crystal and one or more metal dopants as a luminescent activator. This class of phosphors recently emerged as a color converter capable of converting near UV (nUV) or blue light to green, orange and red light. The host crystal of carbidonitride phosphors is comprised of —N—Si—C— networks in which the strongly covalent bonds of Si—C and Si—N serve as the main structural components. Generically, the network structure formed by Si—C bonds has a strong absorption in the entire visible light spectral region, and therefore has been previously considered not suitable for use in host materials for high efficiency phosphors. For example, in certain nitride-silicon-carbide phosphors in which $Ce^{3+}$ is the dopant, the electronic interaction between $Ce^{3+}$ and the (—N—Si—C—) networks results in a strong absorption in 400-500 nm wavelengths, making the phosphor less reflective in that particular spectral region of visible light. This effect is detrimental to achieving a phosphor having a high emission efficiency.

It has now been discovered that in certain carbidonitride phosphor formulations, carbide actually enhances, rather than quenches, the luminescence of a phosphor, in particular at relatively high temperatures (e.g. 200° C.-400° C.). The present invention demonstrates that in certain carbidonitride phosphor formulations, the absorption in the visible light spectral region actually decreases as the amount of carbide increases. These carbide-containing phosphors have excellent thermal stability of emission and high emission efficiency.

SUMMARY OF THE INVENTION

In certain embodiments, the present invention is directed to a novel family of carbidonitride-based phosphors expressed by:

$$Ca_{1-x}Al_{x-xy}Si_{1-x+xy}N_{2-x-xy}C_{xy}:A \qquad (1)$$

wherein 0<x<1, 0<y<1, preferably 0.3≦x≦0.8, 0<y<0.5. A is a luminescence activator doped in the crystal structure at a concentration level of about 0.001 mol % to about 10 mol % relative to Ca. Preferably, A can be at least one ion selected from the group including Ce, Pr, Nd, Sm, Eu, Gd, Tb, Dy, Ho, Er, Tm, Yb, Lu, Mn, Bi, and Sb, more preferably $Ce^{3+}$, $Eu^{2+}$, $Eu^{3+}$, $Tb^{3+}$, $Yb^{2+}$ and $Mn^{2+}$.

In certain embodiments, the present invention is directed to a novel family of carbidonitride-based phosphors expressed by:

$$Ca_{1-x-z}Na_zM(III)_{x-xy-z}Si_{1-x+xy+z}N_{2-x-xy}C_{xy}:A \qquad (2)$$

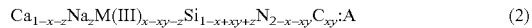

wherein 0<x<1, 0<y<1, 0≦z<1, x>xy+z, and 0<x−xy−z<1, preferably 0.3≦x≦0.8, 0<y<0.5, 0≦z<0.45, x>xy+z, and 0<x−xy−z<1. M(III) is at least one trivalent cation, and may be selected from the group including B, Al, Ga, In, Sc, Y, La and Gd, and other trivalent transition metal ions. A is a luminescence activator doped in the crystal structure at a concentration level of about 0.001 mol % to about 10 mol % relative to Ca. Preferably, A can be at least one ion selected from the group including Ce, Pr, Nd, Sm, Eu, Gd, Tb, Dy, Ho, Er, Tm, Yb, Lu, Mn, Bi, and Sb, more preferably $Ce^{3+}$, $Eu^{2+}$, $Eu^{3+}$, $Tb^{3+}$, $Yb^{2+}$ and $Mn^{2+}$.

In certain embodiments, the present invention is directed to a novel family of carbidonitride-based phosphors expressed by:

$$M(II)_{1-x-z}M(I)_zM(III)_{x-xy-z}Si_{1-x+xy+z}N_{2-x-xy}C_{xy}:A \qquad (3)$$

wherein $0<x<1$, $0<y<1$, $0\leq z<1$, $x+z<1$, $x>xy+z$, and $0<x-xy-z<1$, preferably $0.3\leq x\leq 0.8$, $0\leq y<0.5$, $0\leq z<0.45$, $x+z<1$, $x>xy+z$, and $0<x-xy-z<1$. M(II) is at least one divalent cation, and may be selected from the group including Be, Mg, Ca, Sr, Ba, Cu, Co, Ni, Pd, Zn, Cd and other divalent transition metal ions. M(I) is at least one monovalent cation, and may be selected from the group including Li, Na, K, Rb, Cu, Ag and Au. M(III) is at least one trivalent cation, and may be selected from the group including B, Al, Ga, In, Sc, Y, La and Gd, and other trivalent transition metal ions. A is a luminescence activator doped in the crystal structure at a concentration level of about 0.001 mol % to about 10 mol % relative to M(II). Preferably, A can be at least one ion selected from the group including Ce, Pr, Nd, Sm, Eu, Gd, Tb, Dy, Ho, Er, Tm, Yb, Lu, Mn, Bi, and Sb, more preferably $Ce^{3+}$, $Eu^{2+}$, $Eu^{3+}$, $Tb^{3+}$, $Yb^{2+}$ and $Mn^{2+}$.

In certain embodiments, the present invention is directed to a novel family of carbidonitride-based phosphors expressed by:

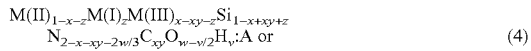
(4)

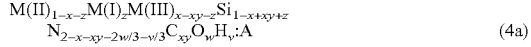
(4a)

wherein $0<x<1$, $0<y<1$, $0\leq z<1$, $0\leq v<1$, $0<w<1$, $x+z<1$, $x>xy+z$, and $0<x-xy-z<1$, preferably $0.3\leq x\leq 0.8$, $0\leq y<0.5$, $0\leq z<0.45$, $0\leq v<0.3$, $0<w<0.3$, $x+z<1$, $x>xy+z$, and $0<x-xy-z<1$. M(II) is at least one divalent cation, and may be selected from the group including Be, Mg, Ca, Sr, Ba, Cu, Co, Ni, Pd, Zn, Cd and other divalent transition metal ions. M(I) is at least one monovalent cation, and may be selected from the group including Li, Na, K, Rb, Cu, Ag and Au. M(III) is at least one trivalent cation, and may be selected from the group including B, Al, Ga, In, Sc, Y, La and Gd, and other trivalent transition metal ions. H is at least one monovalent anion, and may be selected from the group including F, Cl, Br and I. In formulation (4), the monovalent anion replaces a certain amount (v/2) of oxygen. In formulation (4a), the monovalent anion replaces a certain amount (v/3) of nitrogen. A is a luminescence activator doped in the crystal structure at a concentration level of about 0.001 mol % to about 10 mol % relative to M(II). Preferably, A can be at least one ion selected from the group including Ce, Pr, Nd, Sm, Eu, Gd, Tb, Dy, Ho, Er, Tm, Yb, Lu, Mn, Bi, and Sb, more preferably $Ce^{3+}$, $Eu^{2+}$, $Eu^{3+}$, $Tb^{3+}$, $Yb^{2+}$ and $Mn^{2+}$.

In certain embodiments, the crystal structure of host crystal of the phosphor of the present invention is an orthorhombic or monoclinic crystal system. In certain embodiments, the crystal structure of the host crystal of the phosphor belongs to space group $Cmc2_1$ or $Cc$.

In certain embodiments, the crystal structure of the host crystal of the phosphor of the present invention is an orthorhombic system, wherein the unit cell parameter a of the host crystal is between about 9.65 Å and about 9.90 Å; the unit cell parameter b of the host crystal is between about 5.55 Å and about 5.80 Å; and the unit cell parameter c of the host crystal is between about 5.000 Å and about 5.15 Å. In further embodiments, unit cell parameter a can be between about 9.75 Å and about 9.85 Å, between about 9.75 Å and about 9.80 Å, or between about 9.79 Å and about 9.81 Å; unit cell parameter b can be between about 5.60 Å and about 5.75 Å, between about 5.60 Å and 5.70 Å, or between about 5.64 Å and about 5.67 Å; and unit cell parameter c can be between about 5.000 Å and 5.10 Å, between about 5.05 Å and about 5.10 Å, or between about 5.05 Å and about 5.07 Å.

In certain embodiments, the crystal structure of the host crystal of the phosphor of the present invention is a monoclinic system, wherein the unit cell parameter a of the host crystal is between about 9.65 Å and about 9.90 Å; the unit cell parameter b of the host crystal is between about 5.55 Å and about 5.80 Å; the unit cell parameter c of the host crystal is between about 5.000 Å and about 5.15 Å; and the unit cell parameter β (beta) of the host crystal is between about 87 degrees and about 93 degrees. In further embodiments, unit cell parameter a can be between about 9.75 Å and about 9.85 Å, between about 9.75 Å and about 9.80 Å, or between about 9.79 Å and about 9.81 Å; unit cell parameter b can be between about 5.60 Å and about 5.75 Å, between about 5.60 Å and 5.70 Å, or between about 5.64 Å and about 5.67 Å; and unit cell parameter c can be between about 5.000 Å and 5.10 Å, between about 5.05 Å and about 5.10 Å, or between about 5.05 Å and about 5.07 Å; and the unit cell parameter β (beta) of the host crystal can be between about 88 degrees and about 92 degrees, between about 89 and about 91 degrees, and between about 90 and about 91 degrees.

In certain embodiments, the present invention is directed to a light emitting device comprising a light source which emits light having a first luminescence spectrum, and a first phosphor which, upon irradiation with light from the light source, emits light having a second luminescence spectrum that is different than the first luminescence spectrum; wherein the first phosphor comprises at least one phosphor selected from the group consisting of:

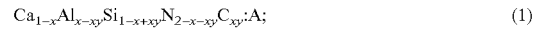
(1)

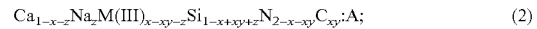
(2)

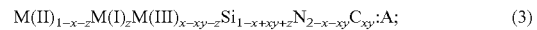
(3)

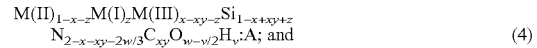
(4)

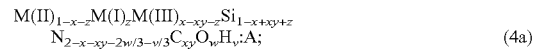
(4a)

wherein $0<x<1$, $0<y<1$, $0\leq z<1$, $0\leq v<1$, $0<w<1$, $x+z<1$, $x>xy+z$, and $0<x-xy-z<1$; M(II) is at least one divalent cation; M(I) is at least one monovalent cation; M(III) is at least one trivalent cation; H is at least one monovalent anion; and A is a luminescence activator.

In certain light emitting device embodiments, M(II) is selected from the group consisting of Be, Mg, Ca, Sr, Ba, Cu, Co, Ni, Pd, Zn, and Cd; M(I) is selected from the group consisting of Li, Na, K, Rb, Cu, Ag and Au; M(III) is selected from the group consisting of B, Al, Ga, In, Sc, Y, La and Gd; H is selected from the group consisting of F, Cl, Br and I; and/or A comprises at least one metal ion selected from the group consisting of Ce, Pr, Nd, Sm, Eu, Gd, Tb, Dy, Ho, Er, Tm, Yb, Lu, Mn, Bi, and Sb.

In certain embodiments, the light emitting device of the present invention comprises a phosphor expressed by (1) $Ca_{1-x}Al_{x-xy}Si_{1-x+xy}N_{2-x-xy}C_{xy}$:A.

In other embodiments, the light emitting device of the present invention comprises a phosphor expressed by (2) $Ca_{1-x-z}Na_zM(III)_{x-xy-z}Si_{1-x+xy+z}N_{2-x-xy}C_{xy}$:A.

In further embodiments, the light emitting device of the present invention comprises a phosphor expressed by (3) $M(II)_{1-x-z}M(I)_zM(III)_{x-xy-z}Si_{1-x+xy+z}N_{2-x-xy}C_{xy}$:A.

In other embodiments, the light emitting device of the present invention comprises a phosphor expressed by (4) $M(II)_{1-x-z}M(I)_zM(III)_{x-xy-z}Si_{1-x+xy+z}N_{2-x-xy-2w/3}C_{xy}O_{w-v/2}H_v$:A.

In further embodiments, the light emitting device of the present invention comprises a phosphor expressed by (4a) $M(II)_{1-x-z}M(I)_zM(III)_{x-xy-z}Si_{1-x+xy+z}N_{2-x-xy-2w/3-v/3}C_{xy}O_wH_v$:A.

In certain embodiments, the light emitting device of the present invention comprises a combination of two or more of the phosphors of the present invention.

In certain embodiments of the light emitting device of the present invention, the first luminescence spectrum is from about 330 nm to about 500 nm.

In further embodiments of the light emitting device, the light source is a light emitting diode or a laser diode.

In certain embodiments, the light emitting device of the present inventions comprises a phosphor wherein the host crystal of the phosphor is an orthorhombic or a monoclinic crystal system. In certain embodiments, the crystal structure of the host crystal of such phosphor belongs to space group $Cmc2_1$ or Cc.

In certain embodiments, the light emitting device of the present invention comprises a phosphor wherein the crystal structure of the host crystal of the phosphor is an orthorhombic system, wherein the unit cell parameter a of the host crystal is between about 9.65 Å and about 9.90 Å; the unit cell parameter b of the host crystal is between about 5.55 Å and about 5.80 Å; and the unit cell parameter c of the host crystal is between about 5.000 Å and about 5.15 Å. In further embodiments, unit cell parameter a can be between about 9.75 Å and about 9.85 Å, between about 9.75 Å and about 9.80 Å, or between about 9.79 Å and about 9.81 Å; unit cell parameter b can be between about 5.60 Å and about 5.75 Å, between about 5.60 Å and 5.70 Å, or between about 5.64 Å and about 5.67 Å; and unit cell parameter c can be between about 5.000 Å and 5.10 Å, between about 5.05 Å and about 5.10 Å, or between about 5.05 Å and about 5.07 ÅA.

In other embodiments, the light emitting device of the present invention comprises a phosphor wherein the crystal structure of the host crystal of the phosphor is a monoclinic system, wherein the unit cell parameter a of the host crystal is between about 9.65 Å and about 9.90 Å; the unit cell parameter b of the host crystal is between about 5.55 Å and about 5.80 Å; the unit cell parameter c of the host crystal is between about 5.000 Å and about 5.15 Å; and the unit cell parameter β (beta) of the host crystal is between about 87 degrees and about 93 degrees. In further embodiments, unit cell parameter a can be between about 9.75 Å and about 9.85 Å, between about 9.75 Å and about 9.80 Å, or between about 9.79 Å and about 9.81 Å; unit cell parameter b can be between about 5.60 Å and about 5.75 Å, between about 5.60 Å and 5.70 Å, or between about 5.64 Å and about 5.67 Å; and unit cell parameter c can be between about 5.000 Å and 5.10 Å, between about 5.05 Å and about 5.10 Å, or between about 5.05 Å and about 5.07 Å; and the unit cell parameter β (beta) of the host crystal can be between about 88 degrees and about 92 degrees, between about 89 and about 91 degrees, and between about 90 and about 91 degrees.

In certain embodiments of the light emitting device comprises a second phosphor.

In further embodiments of the light emitting device, the second phosphor comprises one or more of the following phosphors: a red-emitting phosphor, a blue-emitting phosphor, a yellow-emitting phosphor, and a green-emitting phosphor. In certain embodiments, the second phosphor is selected from the group consisting of a red-emitting phosphor, a blue-emitting phosphor, a yellow-emitting phosphor, and a green-emitting phosphor.

In some embodiments, the light emitting device comprises a phosphor of the present invention combined with a red-emitting phosphor. In other embodiments, the light emitting device comprises a phosphor of the present invention combined with a blue-emitting phosphor. In other embodiments, the light emitting device comprises a phosphor of the present invention combined with a yellow-emitting phosphor. In other embodiments, the light emitting device comprises a phosphor of the present invention combined with a green-emitting phosphor.

In certain embodiments of the light emitting device, the second phosphor is a green-emitting phosphor or a yellow-emitting phosphor. In further embodiments, the second phosphor is a YAG:Ce phosphor, a green or yellow silicate phosphor, or a green sulfide phosphor.

In certain embodiments, the light emitting device of the present invention comprises at least two additional phosphors, wherein said at least two additional phosphors each comprise one or more of the following phosphors: a red-emitting phosphor, a blue-emitting phosphor, a yellow-emitting phosphor, and a green-emitting phosphor.

In certain embodiments, the light emitting device of the present invention comprises a phosphor of the present invention and two red-emitting phosphors. In other embodiments, the light emitting device of the present invention comprises a phosphor of the present invention and two blue-emitting phosphors. In other embodiments, the light emitting device of the present invention comprises a phosphor of the present invention and two yellow-emitting phosphors. In other embodiments, the light emitting device of the present invention comprises a phosphor of the present invention and two green-emitting phosphors.

In certain embodiments, the light emitting device of the present invention comprises a phosphor of the present invention, and one red-emitting and one blue-emitting phosphor. In other embodiments, the light emitting device of the present invention comprises a phosphor of the present invention, and one red-emitting and one green-emitting phosphor. In other embodiments, the light emitting device of the present invention comprises a phosphor of the present invention, and one red-emitting and one yellow-emitting phosphor. In other embodiments, the light emitting device of the present invention comprises a phosphor of the present invention, and one blue-emitting and one green-emitting phosphor. In other embodiments, the light emitting device of the present invention comprises a phosphor of the present invention, and one blue-emitting and one yellow-emitting phosphor. In other embodiments, the light emitting device of the present invention comprises a phosphor of the present invention, and one green-emitting and one yellow-emitting phosphor.

In certain embodiments, the light emitting device of the present invention comprises a phosphor of the present invention, and one red-emitting, one blue-emitting, and one green-emitting phosphor. In other embodiments, the light emitting device of the present invention comprises a phosphor of the present invention, and one red-emitting, one blue-emitting, and one yellow-emitting phosphor. In certain embodiments, the light emitting device of the present invention comprises a phosphor of the present invention, and one red-emitting, one green-emitting, and one yellow-emitting phosphor. In certain embodiments, the light emitting device of the present invention comprises a phosphor of the present invention, and one blue-emitting, one green-emitting, and one yellow-emitting phosphor.

In further embodiments, the light emitting device of the present invention comprises a phosphor of the present invention and more than three additional phosphors.

In certain embodiments, the light emitting device of the present invention emits white light. In some embodiments, the light emitting device emits warm white light. In other embodiments, the light emitting device emits cool white light.

DEFINITIONS

As used herein, "activator" refers to the atomic or ionic species that emits light with the support of the host crystal. The activator may be doped in the host crystal in a very small amount, as further described herein.

As used herein, "co-activator" refers to an additional activator in the same host crystal.

As used herein, "dopant" refers to an atomic or ionic species that is doped in a host crystal.

As used herein, "particle" refers to an individual crystal of phosphor.

As used herein, "grain" refers to an agglomeration, aggregation, polycrystalline or polymorph of phosphor particles, where the particles are not easily separated as compared to phosphor particles of a powder.

As used herein, the term "phosphor" refers to a phosphor in any appropriate form, such as a phosphor particle, a phosphor grain, or phosphor powder comprised of phosphor particles, grains, or a combination thereof.

As used herein, "light source" refers to any source of light capable of exciting or irradiating the phosphors of the present invention, including without limitation a Group III-V semiconductor quantum well-based light emitting diode, a laser diode, or a phosphor other than the phosphor of a light emitting device of the present invention. The light source of the present invention can either excite/irradiate the phosphor directly, or excite another system to thereby provide the excitation energy for the phosphor indirectly.

Temperatures described herein for processes involving a substantial gas phase are of the oven or other reaction vessel in question, not of the reactants per se.

"White light," as used herein, is light of certain chromaticity coordinate values (e.g., Commission Internationale de l'Éclairage (CIE)), which are well-known in the art. Correlated color temperature of a light source is the temperature of an ideal black-body radiator that radiates light of comparable hue to that light source. Higher color temperatures (5,000 K or more) are called cool colors (or "cool white"); lower color temperatures (2,700-3,000 K) are called warm colors (or "warm white").

For the purposes of the examples described herein, the quantum efficiency (QE) was measured against an internal standard sample.

Unless defined otherwise, all technical and scientific terms used herein have the same meaning as commonly understood by one of ordinary skill in the art to which this invention belongs. All technical and scientific terms used herein have the same meaning when used. It must be noted that, as used herein and in the appended claims, the singular forms "a", "and", and "the" include plural references unless the context clearly dictates otherwise.

In the description of phosphors, a conventional notation is used, wherein the chemical formula for the host crystal is given first, followed by a colon and the formula for the activator(s) and co-activator(s).

BRIEF DESCRIPTION OF THE FIGURES

FIG. 31 depicts the emission spectra of exemplary carbidonitride pcLEDs of the present invention. FIG. 31(a) depicts the emission spectrum of a pcLED comprising sample no. 2.2. FIG. 31(b) depicts the emission spectrum of a pcLED comprising sample no. 2.7. FIG. 31(c) depicts the emission spectrum of a pcLED comprising sample no. 4.1. FIG. 31(d) depicts the emission spectrum of a pcLED comprising sample no. 4.3.

DETAILED DESCRIPTION

Figure 1:
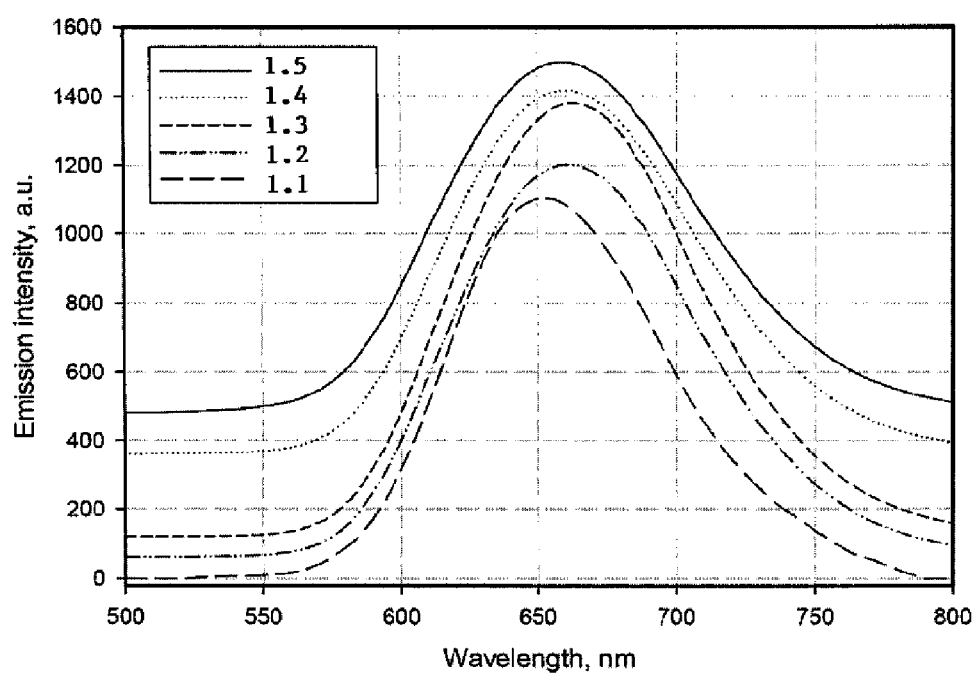
FIG. 1 depicts the fluorescence emission spectra of phosphor samples of formulation (1) with the excitation of 460 nm.

In certain embodiments, the present invention is directed to a novel family of carbidonitride-based phosphors expressed by:

$$Ca_{1-x}Al_{x-xy}Si_{1-x+xy}N_{2-x-xy}C_{xy}:A \quad (1)$$

wherein 0<x<1, 0<y<1, preferably 0.3≦x≦0.8, 0<y<0.5. A is a luminescence activator doped in the crystal structure at a concentration level of about 0.001 mol % to about 10 mol % relative to Ca. Preferably, A can be at least one ion selected from the group including Ce, Pr, Nd, Sm, Eu, Gd, Tb, Dy, Ho, Er, Tm, Yb, Lu, Mn, Bi, and Sb, more preferably $Ce^{3+}$, $Eu^{2+}$, $Eu^{3+}$, $Tb^{3+}$, $Yb^{2+}$ and $Mn^{2+}$. Compositionally, the host crystal of formulation (1) is a combination of $CaSiN_2$ and a solid solution AlN/SiC. Both AlN and SiC (2H Wurtzite) are crystallized in a hexagonal system which belongs to space group P63mc, and $CaSiN_2$ can be either cubic or orthorhombic crystal system. Such a combination can be expressed by the following equation:

$$(1-x)CaSiN_2+xAl_{1-y}Si_yN_{1-y}C_y \rightarrow Ca_{1-x}Al_{x-xy}Si_{1-x+xy}N_{2-x-xy}C_{xy}$$

where both carbon and nitrogen are constituent atoms of the host lattice, and can replace each other in the formulation.

In certain embodiments, the present invention is directed to a novel family of carbidonitride-based phosphors expressed by:

$$Ca_{1-x-z}Na_zM(III)_{x-xy-z}Si_{1-x+xy+z}N_{2-x-xy}C_{xy}:A \quad (2)$$

wherein 0<x<1, 0<y<1, 0≦z<1, x>xy+z, and 0<x−xy−z<1, preferably 0.3≦x≦0.8, 0<y<0.5, 0≦z<0.45, x>xy+z, and 0<x−xy−z<1. M(III) is at least one trivalent cation, and may be selected from the group including B, Al, Ga, In, Sc, Y, La and Gd, and other trivalent transition metal ions. A is a luminescence activator doped in the crystal structure at a concentration level of about 0.001 mol % to about 10 mol % relative to Ca. Preferably, A can be at least one ion selected from the group including Ce, Pr, Nd, Sm, Eu, Gd, Tb, Dy, Ho, Er, Tm, Yb, Lu, Mn, Bi, and Sb, more preferably $Ce^{3+}$, $Eu^{2+}$, $Eu^{3+}$, $Tb^{3+}$, $Yb^{2+}$ and $Mn^{2+}$.

In certain embodiments, the present invention is directed to a novel family of carbidonitride-based phosphors expressed by:

$$M(II)_{1-x-z}M(I)_zM(III)_{x-xy-z}Si_{1-x+xy+z}N_{2-x-xy}C_{xy}:A \quad (3)$$

wherein 0<x<1, 0<y<1, 0≦z<1, x+z<1, x>xy+z, and 0<x−xy−z<1, preferably 0.3≦x≦0.8, 0≦y<0.5, 0≦z<0.45, x+z<1, x>xy+z, and 0<x−xy−z<1. M(II) is at least one divalent cation, and may be selected from the group including Be, Mg, Ca, Sr, Ba, Cu, Co, Ni, Pd, Zn, Cd and other divalent transition metal ions. M(I) is at least one monovalent cation, and may be selected from the group including Li, Na, K, Rb, Cu, Ag and Au. M(III) is at least one trivalent cation, and may be selected from the group including B, Al, Ga, In, Sc, Y, La and Gd, and other trivalent transition metal ions. A is a luminescence activator doped in the crystal structure at a concentration level of about 0.001 mol % to about 10 mol % relative to M(II). Preferably, A can be at least one ion selected from the group including Ce, Pr, Nd, Sm, Eu, Gd, Tb, Dy, Ho, Er, Tm, Yb, Lu, Mn, Bi, and Sb, more preferably $Ce^{3+}$, $Eu^{2+}$, $Eu^{3+}$, $Tb^{3+}$, $Yb^{2+\ and\ Mn2+}$.

In formulations (2) and (3) of the present invention, the divalent cation M(II) and trivalent M(III) are partially replaced by the monovalent cation M(I) and Si by a way of cross-substitution, e.g., $[M(I)Si]^{5+} \rightarrow [CaAl]^{5+}$ (or, in terms of the present invention, $[M(II)M(III)]^{5+}$). This substitution results in a formulation expressed as follows:

$$Ca_{1-x}Al_{x-xy}Si_{1-x+xy}N_{2-x-xy}C_{xy}+z[NaSi]^{5+} \rightarrow Ca_{1-x-z}Na_zAl_{x-xy-z}Si_{1-x+xy+z}N_{2-x-xy}C_{xy}+z[CaAl]^{5+}$$

$$M(II)_{1-x}M(III)_{x-xy}Si_{1-x+xy}N_{2-x-xy}C_{xy}+z[M(I)Si]^{5+} \rightarrow M(II)_{1-x-z}M(I)_zM(III)_{x-xy-z}Si_{1-x+xy+z}N_{2-x-xy}C_{xy}+z[M(II)M(III)]^{5+}$$

in which the resulting formulation of the host crystal, $M(II)_{1-x-z}M(I)_zM(III)_{x-xy-z}Si_{1-x+xy+z}N_{2-x-xy}C_{xy}$, is comprised of both carbon and nitrogen, which can partially replace each other in the formulation.

Furthermore, in further embodiments of the invention (formulations (4) and (4a) below), oxygen and halogen anions are added to the host crystal. In formulation (4), the nitrogen is partially substituted by the oxygen and the oxygen is, in turn, replaced partially by halogen. Alternatively, in the formulation (4a), the nitrogen is partially replaced by oxygen and/or halogen. These formulations of phosphor are expressed by:

$$M(II)_{1-x-z}M(I)_zM(III)_{x-xy-z}Si_{1-x+xy+z}N_{2-x-xy-2w/3}C_{xy}O_{w-v/2}H_v:A \text{ and} \quad (4)$$

$$M(II)_{1-x-z}M(I)_zM(III)_{x-xy-z}Si_{1-x+xy+z}N_{2-x-xy-2w/3-v/3}C_{xy}O_wH_v:A \quad (4a)$$

wherein 0<x<1, 0<y<1, 0≦z<1, 0≦v<1, 0<w<1, x+z<1, x>xy+z, and 0<x−xy−z<1, preferably 0.3≦x≦0.8, 0≦y<0.5, 0≦z<0.45, 0≦v<0.3, 0<w<0.3, x+z<1, x>xy+z, and 0<x−xy−z<1. M(II) is at least one divalent cation, and may be selected from the group including Be, Mg, Ca, Sr, Ba, Cu, Co, Ni, Pd, Zn, Cd and other divalent transition metal ions. M(I) is at least one monovalent cation, and may be selected from the group including Li, Na, K, Rb, Cu, Ag and Au. M(III) is at least one trivalent cation, and may be selected from the group including B, Al, Ga, In, Sc, Y, La and Gd, and other trivalent transition metal ions. H is at least one monovalent anion, and may be selected from the group including F, Cl, Br and I. In formulation (4), the monovalent anion replaces a certain amount (v/2) of oxygen. In formulation (4a), the monovalent anion replaces a certain amount (v/3) of nitrogen. A is a luminescence activator doped in the crystal structure at a concentration level of about 0.001 mol % to about 10 mol % relative to M(II). Preferably, A can be at least one ion selected from the group including Ce, Pr, Nd, Sm, Eu, Gd, Tb, Dy, Ho, Er, Tm, Yb, Lu, Mn, Bi, and Sb, more preferably $Ce^{3+}$, $Eu^{2+}$, $Eu^{3+}$, $Tb^{3+}$, $Yb^{2+}$ and $Mn^{2+}$.

In the formulations of the present invention, luminescence activator A can be doped in the crystal structure of the phosphor at a concentration level of about 0.001 mol % to about 10 mol % relative to the divalent cation. In some embodiments, A is doped in the crystal structure of the phosphor at a concentration level of between about 0.01 mol % and about 7 mol % relative to the divalent cation. In other embodiments, A is doped in the crystal structure of the phosphor at a concentration level of between about 0.05 mol % and about 5 mol % relative to the divalent cation. In further embodiments, A is doped in the crystal structure of the phosphor at a concentration level of between about 0.5 mol % and about 2.5 mol % relative to the divalent cation.

In certain embodiments, A comprises at least one co-activator.

In certain embodiments, the phosphors of the present invention maintain at least 70% of their relative emission intensity at temperatures up to 250° C. In other embodiments, the phosphors of the present invention maintain at least 85% of their relative emission intensity at temperatures up to 250° C. In other embodiments, the phosphors of the present invention maintain at least 90% of their relative emission intensity at temperatures up to 250° C. In certain embodiments, the phosphors of the present invention maintain at least 70% of their relative emission intensity at temperatures up to 200° C. In certain embodiments, the phosphors of the present invention maintain at least 85% of their relative emission intensity at temperatures up to 200° C. In other embodiments, the phosphors of the present invention maintain at least 90% of their relative emission intensity at temperatures up to 200° C. In further embodiments, the phosphors of the present invention maintain at least 90% of the relative emission intensity at temperatures up to 150° C. In other embodiments, the phosphors of the present invention maintain at least 95% of their relative emission intensity at temperatures up to 150° C.

In certain embodiments, the median diameter of the phosphor particles of the present invention can be from about 2 to about 50 microns, preferably from about 4 to about 30 microns, and more preferably from about 5 to about 20 microns. In some embodiments, the phosphor is a grain. In other embodiments, the phosphor is a particle.

Figure 24:
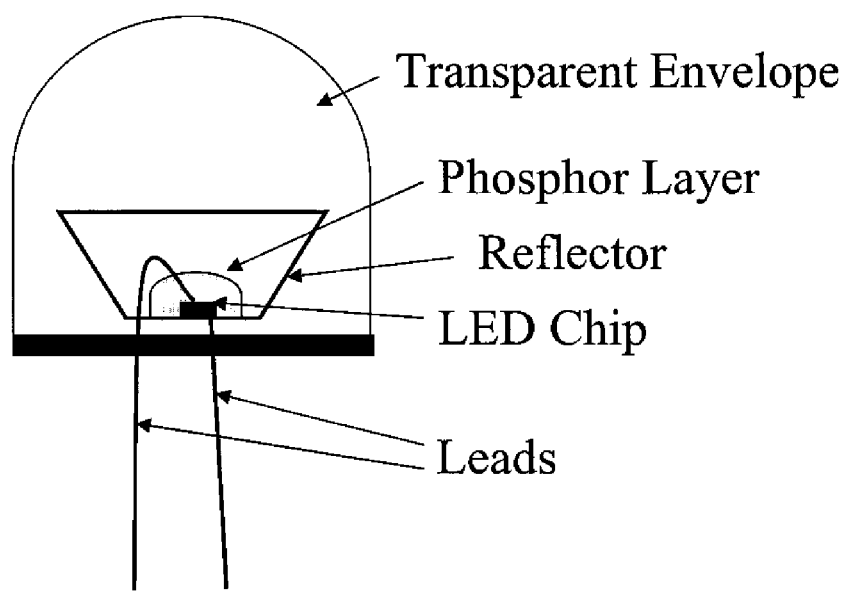
FIG. 24 depicts a light emitting device structure of the present invention.

In certain embodiments, the present invention further provides a light emitting device comprising: a light source emitting light of wavelengths from about 200 to about 600 nm, preferably from about 350 to about 490 nm; and at least one phosphor of the present invention, where the phosphor is positioned to absorb at least a portion of the light output from the light source and effectively modifies the color of the light absorbed from the light source, resulting in an emission of a longer wavelength than that of the light absorbed from the light source. For example, the phosphors of the present invention are mixed with a silicone resin to form a slurry. The phosphor-filled silicone can be applied to a LED chip as shown in FIG. 24. The LED emits light in the near ultraviolet (nUV) range (e.g., about 405 nm) or the blue range (e.g., about 450 nm).

Figure 25:
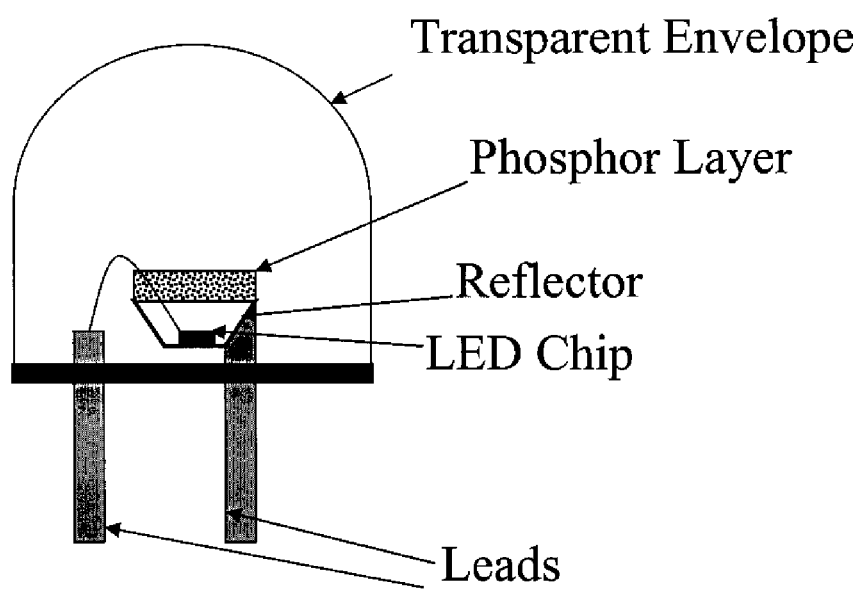
FIG. 25 depicts a light emitting device structure of the present invention.
Figure 26:
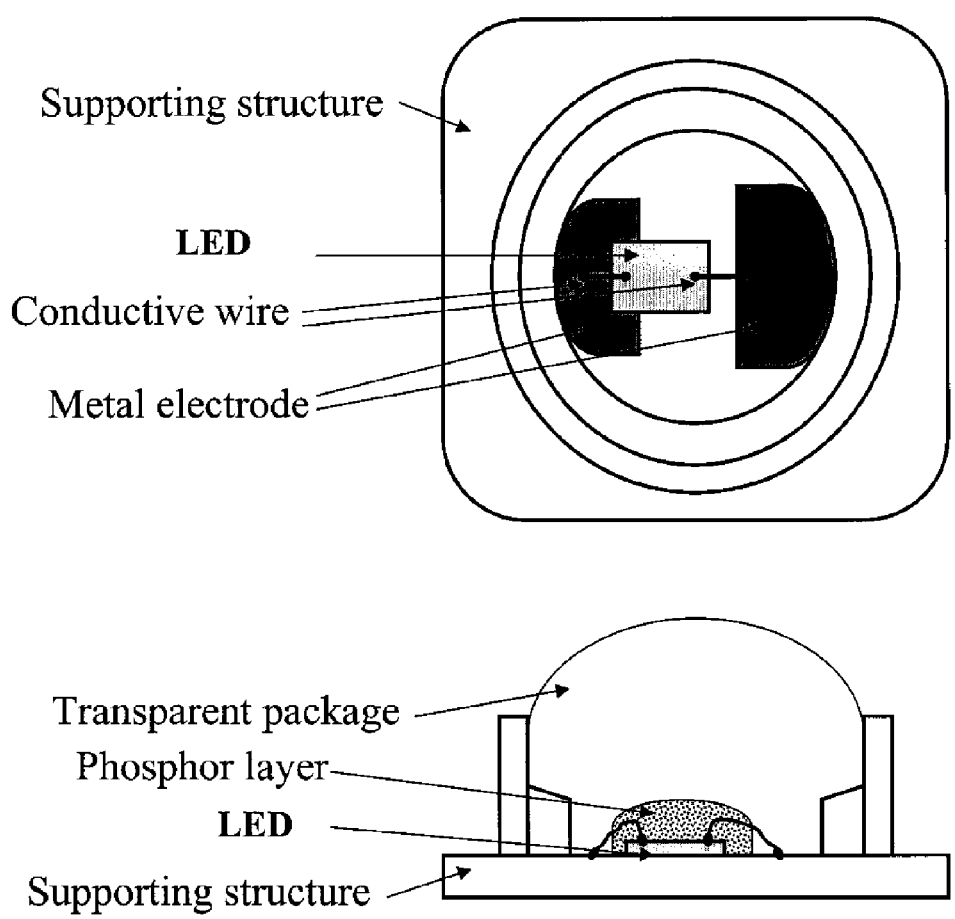
FIG. 26 depicts a light emitting device structure of the present invention.

The light source used in the present invention, can, for example, comprise a gallium nitride-based LED with a light-emitting layer comprising a quantum well structure. The light emitting device can include a phosphor of the present invention and a reflector located so as to direct light from the LED or the phosphor (see FIGS. 24-26). The phosphor of the present invention can be located on the surface of the LED (FIGS. 24 and 26) or separated therefrom (FIG. 25). The light emitting device can further include a translucent material encapsulating the LED and the phosphor as seen in FIGS. 24-26.

In certain embodiments, the light emitting device of the present invention comprises a light source, such as a LED, to either create excitation energy, or to excite another system to thereby provide the excitation energy for the phosphor of the present invention. Devices using the present invention can include, for example, and without limitation, white light producing light emitting devices, indigo light producing light emitting devices, blue light producing light emitting devices, green light producing light emitting devices, yellow light producing light emitting devices, orange light producing light emitting devices, pink light producing light emitting devices, red light producing light emitting devices, or light emitting devices with an output chromaticity defined by the line between the chromaticity of a phosphor of the present invention and that of at least one second light source. Headlights or other navigation lights for vehicles can be made with the light emitting devices of the present invention. The light emitting devices can be output indicators for small electronic devices, such as cell phones and personal digital assistants (PDAs). The light emitting devices of the present invention also can be the backlights of the liquid crystal displays for TV, cell phones, PDAs and laptop computers. Luminaires for general illumination purpose can also be made with the lighting devices of the present invention. Given appropriate power supplies, room lighting can be based on devices of the invention. The warmth (i.e., amount of yellow/red chromaticity) of light emitting devices of the present invention can be manipulated by selection of the ratio of light from a phosphor of the present invention to light from a second source (including, a second phosphor). Semiconductor light source-based white light devices can be used, for example, in a self-emission type display for displaying a predetermined pattern or a graphic design on a display portion of an audio system, a household appliance, a measuring instrument, a medical appliance, and the like. Such semiconductor light source-based light devices also can be used, for example, and without limitation, as light sources of a back-light for a liquid crystal diode (LCD) display, a printer head, a facsimile, a copying apparatus, and the like.

Suitable semiconductor light sources for use in the present invention also are any that create light that excites the phosphors of the present invention, or that excites a different phosphor that in turn excites the phosphors of the present invention. Such semiconductor light sources can be, for example, and without limitation, light sources including: GaN (gallium nitride) type semiconductor light sources; In—Al—Ga—N type semiconductor light sources, such as $In_iAl_jGa_kN$, where i+j+k=about 1, and where one or more of i, j and k can be 0; BN; SiC,; ZnSe; $B_iAl_jGa_kN$, where i+j+k=about 1, and where one or more of i, j, and k can be 0; and $B_iIn_jAl_kGa_lN$, where i+j+k+l=about 1, and where one or more of i, j, k, and l can be 0; and other such similar light sources. The semiconductor light source (e.g., a semiconductor chip) can be based, for example, on III-V or II-VI quantum well structures (meaning structures comprising compounds that combine elements of the periodic table of the chemical elements from Group III with those from Group V or elements from Group II with those from Group VI). In certain embodiments, a blue or a near ultraviolet (nUV) emitting semiconductor light source is used.

In certain embodiments, the phosphors of the present invention can be excited by light from a primary light source, such as, for example, a semiconductor light source (e.g., a LED) emitting in the wavelength range of about 300 to about 500 nm, from about 350 nm to about 450 nm or about 330 nm to about 390 nm, or from a secondary light source, such as, emissions from other phosphor(s) that emit in the wavelength range of about 300 nm to about 500 nm or about 350 nm to about 420 nm. Where the excitation light is secondary, in relation to the phosphors of the present invention, the excitation-induced light is the relevant source light. Devices that use the phosphor of the present invention can include, for example, and without limitation, mirrors, such as, dielectric mirrors, which direct light produced by the phosphors of the present invention to the light output, rather than direct such light to the interior of the device (such as, the primary light source).

The light source (e.g., a LED) can, in certain embodiments, emit light of at least about 200 nm, at least about 250 nm, at least about 255 nm, at least about 260 nm, and so on in increments of about 5 nm to at least about 600. The light source can, in certain embodiments, emit light of at most about 600 nm, at most about 595 nm, at most about 590 nm, and so on in increments of about 5 nm to or less than about 200 nm. In certain embodiments, the light source is a semiconductor light source. When LED chips are used, the LED chips are advantageously filled with a transparent encapsulant with a dome-like shape as shown in FIGS. 24 and 25. The encapsulant provides the mechanical protection on one hand, and the encapsulant further improves the optical property on the other hand (improved light emission of the LED die).

The phosphor may be dispersed in an encapsulant. By the encapsulant, the LED chips disposed on the substrate and a polymer lens are bonded without containing a gas as much as possible. The LED die can be sealed directly by the encapsulant. However, it is also possible that the LED die is sealed with a transparent encapsulant (i.e., in this case, there are the transparent encapsulant and the encapsulant to contain the phosphor). Owing to the refraction indices close to each other, there is little loss of reflection at the interface.

In structural modifications, one or more LED chips are disposed on a substrate in a reflection mirror and the phosphor is dispersed in a lens disposed on the reflection mirror. Alternatively, one or more LED chips may be disposed on a substrate in a reflection mirror and the phosphor coated on the reflection mirror.

In certain embodiments of the present invention, phosphors of the present invention can be dispersed in the light emitting device with a binder, a solidifier, a dispersant, a filler or the like. The binder can be, for example, and without limitation, a light curable polymer, such as, an acrylic resin, an epoxy resin, a polycarbonate resin, a silicone resin, a glass, a quartz and the like. The phosphor of the present invention can be dispersed in the binder by methods known in the art. For example, in some cases, the phosphor can be suspended in a solvent with the polymer suspended, thus forming a slurry, which then can be applied on the light emitting device and the solvent evaporated therefrom. In certain embodiments, the phosphor can be suspended in a liquid, such as, a pre-cured precursor to the resin to form a slurry, the slurry then can be dispersed on the light emitting device and the polymer (resin) cured thereon. Curing can be, for example, by heat, UV, or a curing agent (such as, a free radical initiator) mixed with the precursor. As used herein "cure" or "curing" refers to, relates to or is a process for polymerizing or solidifying a substance or mixture thereof, often to improve stability or usability of the substance or mixture thereof. In certain embodiments, the binder used to disperse the phosphor particles in a light emitting device can be liquefied with heat, thereby, a slurry is formed, and then the slurry is dispersed on the light emitting device and allowed to solidify in situ. Dispersants (meaning a substance that promotes the formation and stabilization of a mixture (e.g., a suspension) of one substance into another) include, for example, and without limitation, titanium oxides, aluminum oxides, barium titanates, silicon oxides, and the like.

The polymer lens advantageously has a spherical or oval cavity. The cavity is filled with the encapsulant. As a result, the LED array is fixed at a short distance from the polymer lens. Thereby, the mechanical structure size can be reduced.

In preferred embodiments, the light emitting devices of the present invention comprise two or more different phosphors, and in this case, at least one of the phosphors is a phosphor as disclosed herein. Thereby, the white tone can be particularly adjusted to be accurate. It can be useful to disperse the phosphors separately, and superimpose the phosphors as layers instead of dispersing the phosphors together in one matrix. Alternatively, the phosphors can be intermixed an dispersed in one matrix. Such layering can be used to obtain a final light emission color by way of a plurality of color conversion processes. For example, the light emission process is: absorption of the light emission of a semiconductor light source by a first phosphor of the present invention, light emission by the first phosphor, absorption of the light emission of the first phosphor by a second phosphor, and the light emission by the second phosphor. A similar arrangement can be utilized where there are more than two phosphors. In certain embodiments, at least one of the additional phosphors is also a phosphor of the present invention. In some embodiments, at least one of the additional phosphors is a phosphor that emits green light when excited by a blue-emitting LED, that, for example, emits light at 460 nm. In other embodiments, at least one of the additional phosphors is a YAG phosphor. In further embodiments, at least one of the additional phosphors is a green-emitting phosphor, for example and with out limitation, cerium activated yttrium aluminum garnet (YAG:$Ce^{3+}$), europium activated orthosilicates, e.g., $(Ca,Sr,Ba)_2SiO_4$:$Eu^{2+}$ and europium activated alkaline earth metal thiogallates [$(Ca,Sr)Ga_2S_4$:$Eu^{2+}$].

In the case that multiple phosphors are used, it may be advantageous that the multiple phosphors are suspended in each matrix, and, in that case, these matrices are disposed back and forth in the light propagation direction. Thereby, the matrix concentration can be reduced compared with the case that the different phosphors are dispersed and mixed together.

EXAMPLES

Example 1

The Preparation of Phosphors of Formulation (1)

Example 1(a)

Powders of $Ca_3N_2$, AlN, $Si_3N_4$, EuN and SiC were mixed in a designed ratio as listed in Table 1 with a mortar and pestle under the protection of $N_2$ atmosphere. In this series of preparations, the formulation parameter x was fixed at x=0.5 while y was varied from 0 to 0.10. This variation corresponds to an increase of C content and a decrease of the [Al]/[Si] ratio, as seen in Table 1. The mixture was then loaded in a firing boat or crucible and was fired at 1600° C. for 6 hours under $N_2/H_2$ atmosphere. The product powder was then ground and sieved.

Figure 2:
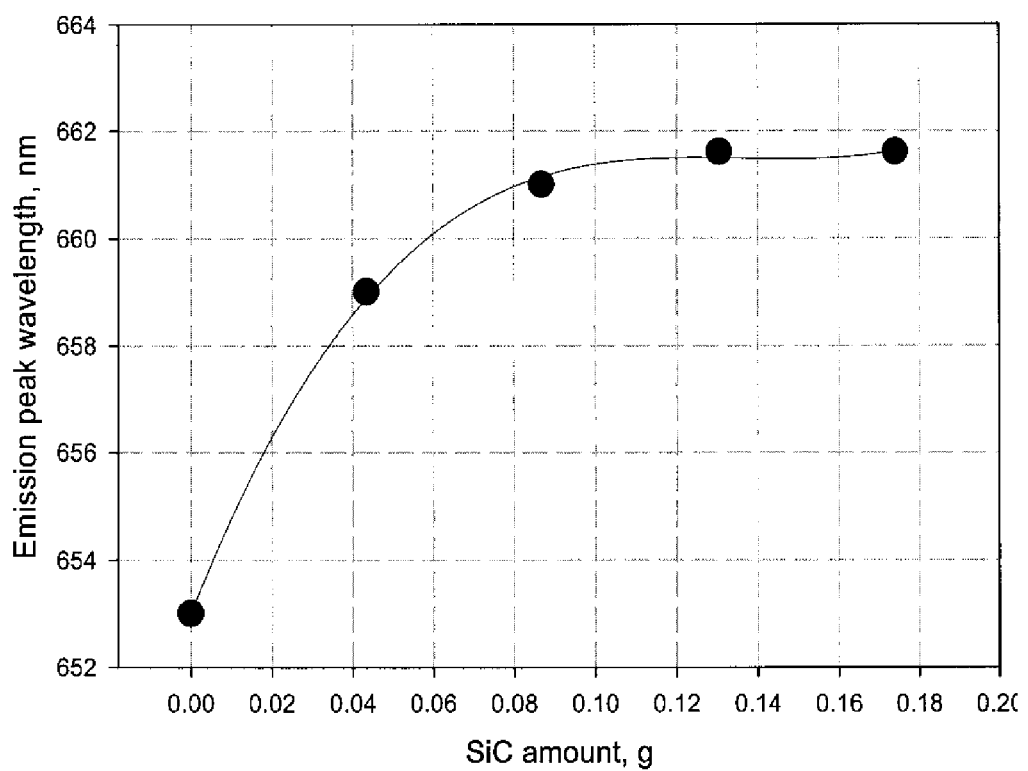
FIG. 2 depicts the dependence of the emission peak wavelength of phosphors of formulation (1) on the amount of SiC added to each phosphor's preparation.

The product is expressed by the formulation of $Ca_{1-x}Al_{x-xy}Si_{1-x+xy}N_{2-x-xy}C_{xy}$:$Eu^{2+}$. This phosphor emits a red light under blue or nUV light excitation (FIG. 1). In the samples set forth in Table 1, the SiC of each sample was increased from sample to sample. A preparation (sample ID 1.1) that contains no SiC, i.e. [SiC]=0, was prepared as a reference sample. As depicted in FIG. 2, the emission peak wavelength is shifted to a longer wavelength as the amount of SiC is increased, resulting from the incorporation of silicon-carbon atoms into the nitride lattice.

Figure 3:
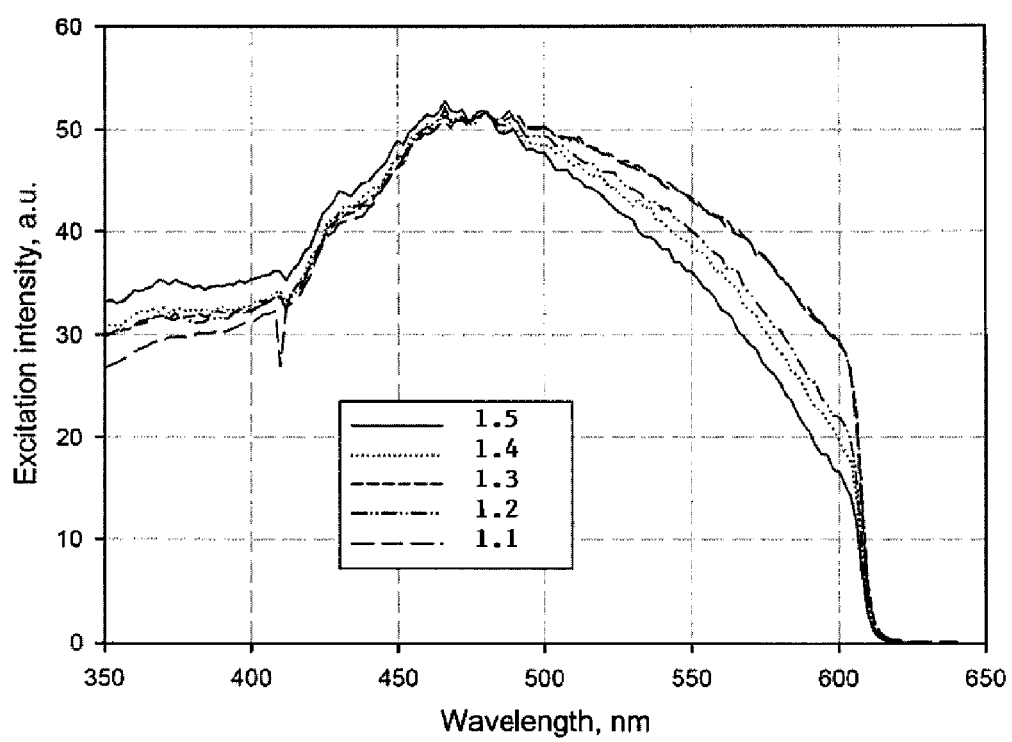
FIG. 3 depicts the fluorescence excitation spectra of phosphors of formulation (1). The fluorescence was monitored at 650 nm.
Figure 4:
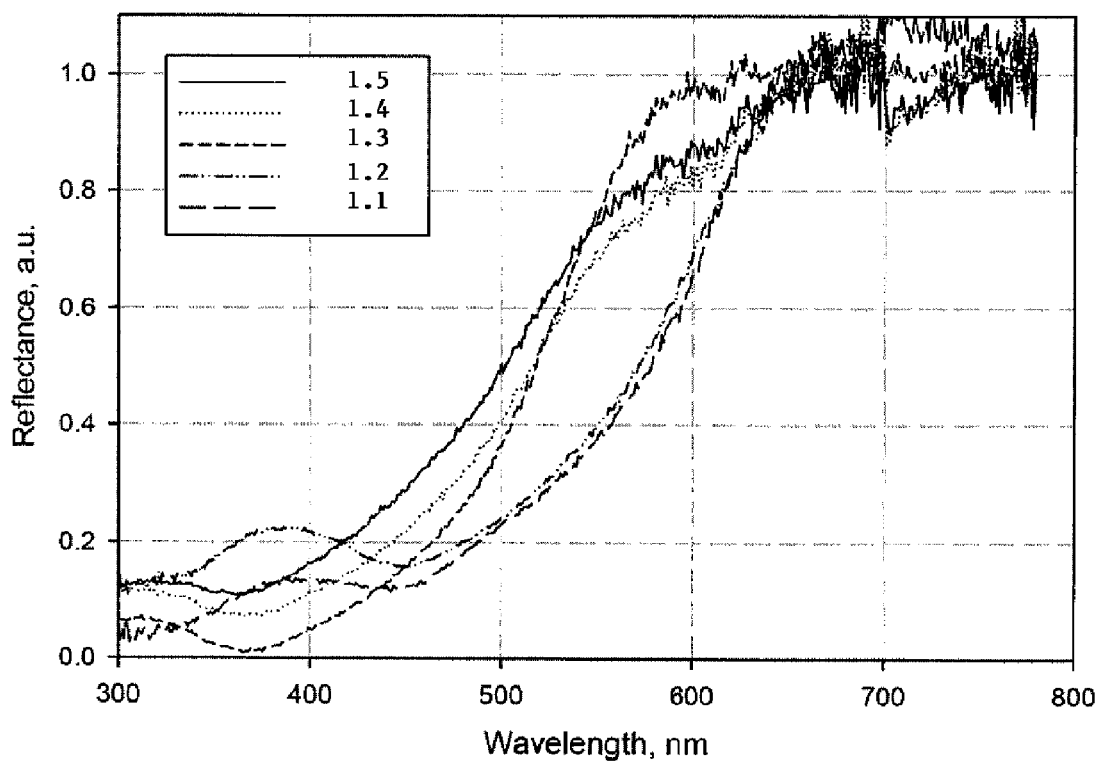
FIG. 4 depicts the optical reflectance of phosphors of formulation (1).
Figure 7:
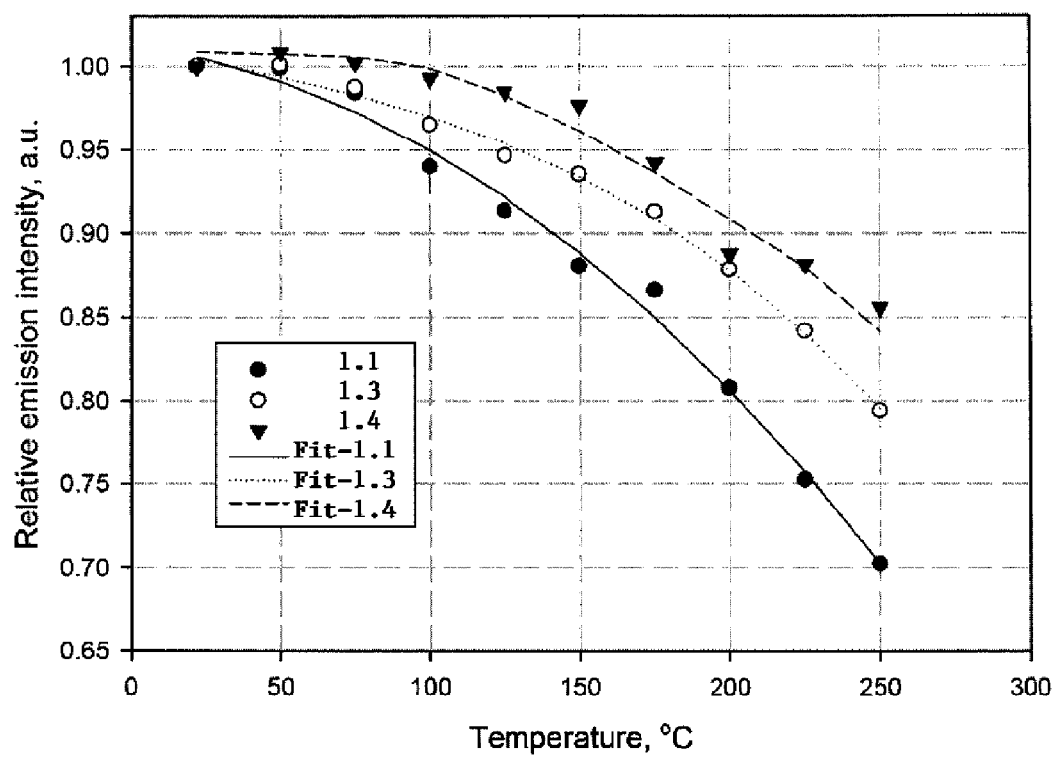
FIG. 7 depicts the temperature dependence of the emission intensity for phosphors expressed by the formula $Ca_{1-x}Al_{x-xy}Si_{1-x+xy}N_{2-x-xy}C_{xy}$:$Eu^{2+}$ (x=0.5, Eu=1 mol %).

The phosphors of these preparations are excited by a light of wavelength from 350 nm to 610 nm, and more efficiently excited by a light of wavelength from 420 nm to 550 nm (FIG. 3). The optical reflectance of the phosphors (FIG. 4) shows a gradual increase in the wavelength range from 460 nm to 620 nm as the added SiC amount is increased, demonstrating that the presence of carbide in the phosphor actually enhances, rather than hinders, optical reflectance.

carbidonitride reflects the incorporation of carbon atoms in the host lattice, specifically, the random partial substitution of the more ionic nitrogen anions. This random substitution of C into the host lattice leading to these carbidonitride species decreases crystallographic symmetry compared to the isostructural nitride (sample ID 1.1). This is reflected in that the structure of these carbidonitrides gives a lower R factor (e.g., $R_{wp}$) when refined in the lower symmetry monoclinic crystal system (i.e., Cc space group) (Tables 3 and 4). Table 5 depicts the major X-ray diffraction peaks for sample ID 1.2. FIG. 7 presents the temperature dependence of the emission intensity of the phosphors. It is shown that the relative emission intensity decreases as temperature increases. The carbidoni-

TABLE 1

Starting materials (in grams) and luminescence characteristics for phosphors of formulation (1).

| | $Ca_{1-x}Al_{x-xy}Si_{1-x+xy}N_{2-x-xy}C_{xy}$: $Eu^{2+}$ | | | | | Luminescence Characteristics | | |
|---|---|---|---|---|---|---|---|---|
| Sample ID | $Ca_3N_2$ | AlN | $Si_3N_4$ | EuN | SiC | QE, % | $\lambda_{em}$, nm | FWHM, nm |
| 1.1 | 1.0613 | 0.8892 | 1.0145 | 0.0360 | 0.000 | 90.5 | 653 | 87 |
| 1.2 | 1.0617 | 0.8450 | 1.0148 | 0.0360 | 0.0435 | 80 | 662 | 87 |
| 1.3 | 1.0620 | 0.8008 | 1.0151 | 0.0360 | 0.0870 | 91 | 661 | 87 |
| 1.4 | 1.0624 | 0.7566 | 1.0154 | 0.0360 | 0.1306 | 73 | 663 | 93 |
| 1.5 | 1.0627 | 0.7123 | 1.0158 | 0.0361 | 0.1742 | 72 | 664 | 93 |

Figure 5:
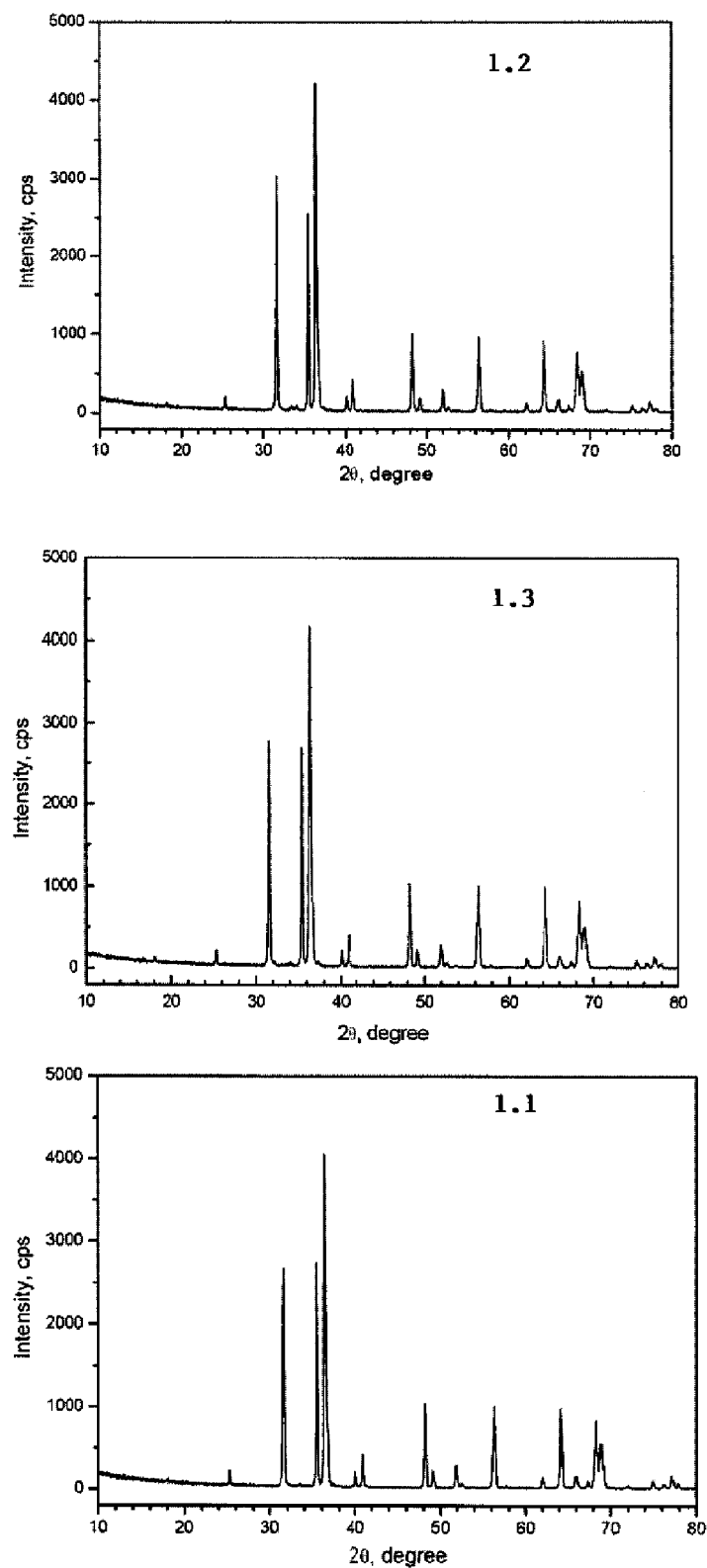
FIG. 5 depicts the X-ray powder diffraction patterns of phosphors of formulation (1).
Figure 6:
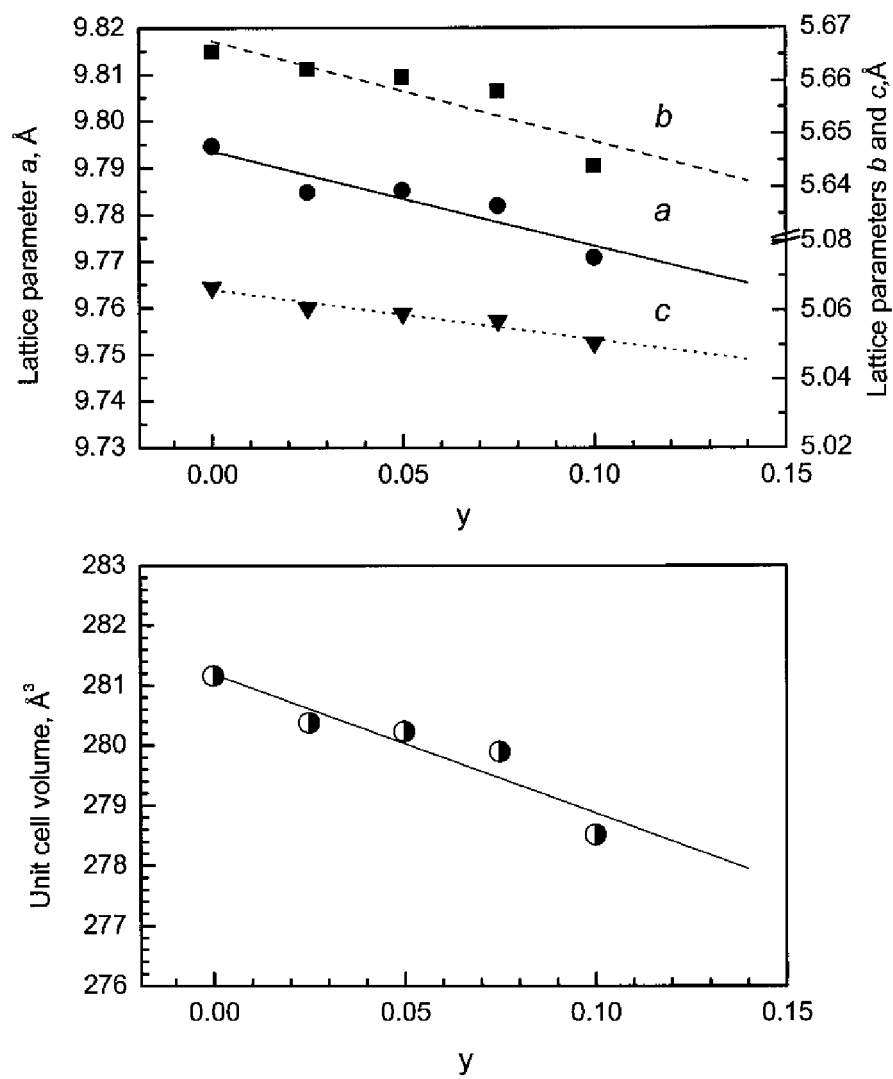
FIG. 6 depicts the lattice parameters of phosphors expressed by the formulation $Ca_{1-x}Al_{x-xy}Si_{1-x+xy}N_{2-x-xy}C_{xy}$:$Eu^{2+}$ (x=0.5, Eu=1 mol %) as a function of y for sample preparations 1.1 through 1.5.

The crystallographic data for these preparations are listed in Table 2. It is shown that the unit cell parameters a, b, c and hence the unit cell volume of the crystalline $Ca_{1-x}Al_{x-xy}Si_{1-x+xy}N_{2-x-xy}C_{xy}$:$Eu^{2+}$ (x=0.5, Eu=1 mol %) decrease as the amount of SiC content in the formulation is increased. FIG. 5 shows the XRD patterns of the phosphors of the preparations. FIG. 6 further depicts the unit cell parameters as function of y for the phosphors of these preparations. The unit cell parameters decrease linearly as the parameter y is increased from y=0 to y=0.1. This decrease corresponds to a decrease of the [Al]/[Si] ratio in the formulation, demonstrating an increase in the number of (Si/Al)—C bonds relative to (Si/Al)—N bonds, as well as an increase in shorter Si—(C/N) bonds relative to longer (Al—C/N) bonds. In fact it is known that the length of bonds of Si—C (or Al—C) is shorter than that of Si—N (or Al—N). In addition to the evidence of the spectroscopic data (emission spectra of FIG. 1; optical reflectance of FIG. 4), the fact that lattice parameters decrease as carbide content increases demonstrates that the Si—C pair is incorporated into the lattice.

TABLE 2

Lattice parameters of $Ca_{1-x}Al_{x-xy}Si_{1-x+xy}N_{2-x-xy}C_{xy}$: $Eu^{2+}$ (x = 0.5, Eu = 1 mol %)

| Sample ID | xy | a (Å) | b (Å) | c (Å) | Unit cell volume (Å³) |
|---|---|---|---|---|---|
| 1.1 | 0 | 9.79468 | 5.66550 | 5.06669 | 281.16 |
| 1.2 | 0.025 | 9.78480 | 5.66225 | 5.06066 | 280.38 |
| 1.3 | 0.05 | 9.78524 | 5.66069 | 5.05903 | 280.23 |
| 1.4 | 0.075 | 9.78196 | 5.65813 | 5.05694 | 279.89 |
| 1.5 | 0.10 | 9.77083 | 5.64391 | 5.05049 | 278.51 |

Tables 3 and 4 show the refined structural parameters and isotropic thermal displacement parameters of $Ca_{0.495}Al_{0.45}Si_{0.55}N_{1.45}C_{0.05}$:$Eu^{2+}$. The crystal structure of tride phosphors (sample IDs 1.3 and 1.4) show higher thermal stability than a nitride phosphor without incorporation of SiC (sample ID 1.1), particularly at high temperatures.

TABLE 3

Refined structural parameters, isotropic thermal displacement parameters $U_{iso}$ (Å²) of $Ca_{0.495}Al_{0.45}Si_{0.55}N_{1.45}C_{0.05}$: $Eu^{2+}$

| Crystal system | Orthorhombic |
|---|---|
| Space group | $Cmc2_1$ (36) |
| Lattice parameters (Å) | a = 9.8067(1) |
| | b = 5.6444(1) |
| | c = 5.0595(1) |
| Unit cell volume (Å³) | V = 280.06(1) |
| Z | 8 |
| $R_{wp}$ | 5.98% |
| $R_p$ | 4.36% |
| $\chi^2$ | 2.36 |

| Atom | x/a | y/b | c/z | $U_{iso}$ x 100 | S.O.F. |
|---|---|---|---|---|---|
| Ca1 | 0 | 0.3151(2) | 0.4975(3) | 0.89 | 0.99 |
| Eu1 | 0 | 0.3151(2) | 0.4975(3) | 0.89 | 0.01 |
| Al1 | 0.1728(1) | 0.1563(2) | 0.0222 | 0.38 | 0.45 |
| Si1 | 0.1728(1) | 0.1563(2) | 0.0222 | 0.38 | 0.55 |
| N1 | 0.2130(3) | 0.1214(5) | 0.3782(4) | 0.35 | 0.967 |
| C1 | 0.2130(3) | 0.1214(5) | 0.3782(4) | 0.35 | 0.033 |
| N2 | 0 | 0.2458(5) | 0.9826(9) | 0.28 | 0.967 |
| C2 | 0 | 0.2458(5) | 0.9826(9) | 0.28 | 0.033 |

TABLE 4

Refined structural parameters, isotropic thermal displacement parameters $U_{iso}$ (Å²) of $Ca_{0.495}Al_{0.45}Si_{0.55}N_{1.45}C_{0.05}$: $Eu^{2+}$

| Crystal system | Monoclinic |
|---|---|
| Space group | Cc (9) |
| Lattice parameters (Å) | a = 9.8071(1) |
| | b = 5.6446(1) |
| | c = 5.0597(1) |
| | β = 90.069(1)° |
| Unit cell volume (Å³) | V = 280.09(1) |

TABLE 4-continued

Refined structural parameters, isotropic thermal displacement parameters $U_{iso}$ (Å$^2$) of $Ca_{0.495}Al_{0.45}Si_{0.55}N_{1.45}C_{0.05}$: $Eu^{2+}$

| | | | | | |
|---|---|---|---|---|---|
| Z | | 8 | | | |
| $R_{wp}$ | | 5.68% | | | |
| $R_p$ | | 4.16% | | | |
| $\chi^2$ | | 2.14 | | | |

| Atom | x/a | y/b | c/z | $U_{iso}$ × 100 | S.O.F. |
|---|---|---|---|---|---|
| Ca1 | 0.6236(5) | 0.8166(2) | 0.3095(5) | 0.94 | 0.99 |
| Eu1 | 0.6236(5) | 0.8166(2) | 0.3095(5) | 0.94 | 0.01 |
| Al1 | 0.30167 | 0.1587(9) | −0.1756(11) | 0.56 | 0.45 |
| Si1 | 0.30167 | 0.1587(9) | −0.1756(11) | 0.56 | 0.55 |
| Al2 | 0.4548(3) | 0.3449(8) | 0.3394 | 0.08 | 0.45 |
| Si2 | 0.4548(3) | 0.3449(8) | 0.3394 | 0.08 | 0.55 |
| N1 | 0.4175(9) | 0.6153(16) | 0.1907(16) | 0.02 | 0.9667 |
| C1 | 0.4175(9) | 0.6153(16) | 0.1907(16) | 0.02 | 0.0333 |
| N2 | 0.3441(10) | 0.1255(15) | 0.1898(15) | 0.10 | 0.9667 |
| C2 | 0.3441(10) | 0.1255(15) | 0.1898(15) | 0.10 | 0.0333 |
| N3 | 0.6212(11) | 0.2526(5) | 0.2934(12) | 0.07 | 0.9667 |
| C3 | 0.6212(11) | 0.2526(5) | 0.2934(12) | 0.07 | 0.0333 |

TABLE 5

The X-ray diffraction peaks of sample ID 1.2 for formulation (1).

| No. | 2 theta (°) | d(Å) | I (%) | (hkl) orthorhombic | (hkl) monoclinic |
|---|---|---|---|---|---|
| 1 | 18.198 | 4.8710 | 1.6 | (1 1 0) | (1 1 0) |
| 2 | 25.439 | 3.4984 | 3.7 | (1 1 1) | (1 1 1) |
| 3 | 31.785 | 2.8130 | 71.1 | (0 2 0) | (0 2 0) |
| 4 | 35.581 | 2.5211 | 58.8 | (0 0 2) | (0 0 2) |
| 5 | 36.526 | 2.4581 | 100.0 | (0 2 1) | (4 0 0) |
| 6 | 40.201 | 2.2414 | 4.1 | (1 1 2) | (1 1 2) |
| 7 | 41.071 | 2.1959 | 9.1 | (2 2 1) | (2 2 1) |
| 8 | 48.390 | 1.8795 | 24.3 | (0 2 2) | (0 2 2) |
| 9 | 49.320 | 1.8462 | 4.3 | (1 3 0) | (1 3 0) |
| 10 | 52.066 | 1.7551 | 6.9 | (2 2 2) | (2 2 2) |
| 11 | 52.726 | 1.7347 | 1.1 | (4 2 1) | (1 3 1) |
| 12 | 56.505 | 1.6273 | 24.8 | (3 3 0) | (3 3 0) |
| 13 | 57.888 | 1.5917 | 0.5 | (1 1 3) | (1 1 3) |
| 14 | 59.640 | 1.5490 | 0.3 | (3 3 1) | (3 3 1) |
| 15 | 62.249 | 1.4902 | 2.4 | (1 3 2) | (1 3 2) |
| 16 | 64.410 | 1.4453 | 22.7 | (0 2 3) | (0 2 3) |
| 17 | 66.271 | 1.4092 | 3.3 | (0 4 0) | (0 4 0) |
| 18 | 67.544 | 1.3857 | 1.5 | (2 2 3) | (2 2 3) |
| 19 | 68.520 | 1.3683 | 18.4 | (3 3 2) | (3 3 2) |
| 20 | 69.150 | 1.3574 | 12.6 | (0 4 1) | (5 3 0) |
| 21 | 72.135 | 1.3084 | 0.6 | (2 4 1) | (2 4 1) |
| 22 | 75.152 | 1.2632 | 1.8 | (0 0 4) | (0 0 4) |
| 23 | 76.469 | 1.2447 | 1.0 | (4 2 3) | (1 3 3) |
| 24 | 77.385 | 1.2322 | 2.7 | (6 2 2) | (0 4 2) |
| 25 | 78.104 | 1.2226 | 0.7 | (2 0 4) | (4 4 0) |
| 26 | 80.399 | 1.1934 | 1.0 | (2 4 2) | (2 4 2) |
| 27 | 80.908 | 1.1872 | 0.5 | (4 4 1) | (4 4 1) |
| 28 | 83.864 | 1.1527 | 1.9 | (3 1 4) | (0 2 4) |
| 29 | 86.715 | 1.1220 | 1.1 | (7 3 0) | (1 5 0) |
| 30 | 88.936 | 1.0996 | 0.4 | (4 4 2) | (4 4 2) |
| 31 | 89.234 | 1.0967 | 0.4 | (8 2 1) | (7 3 1) |

Example 1(b)

Figure 8:
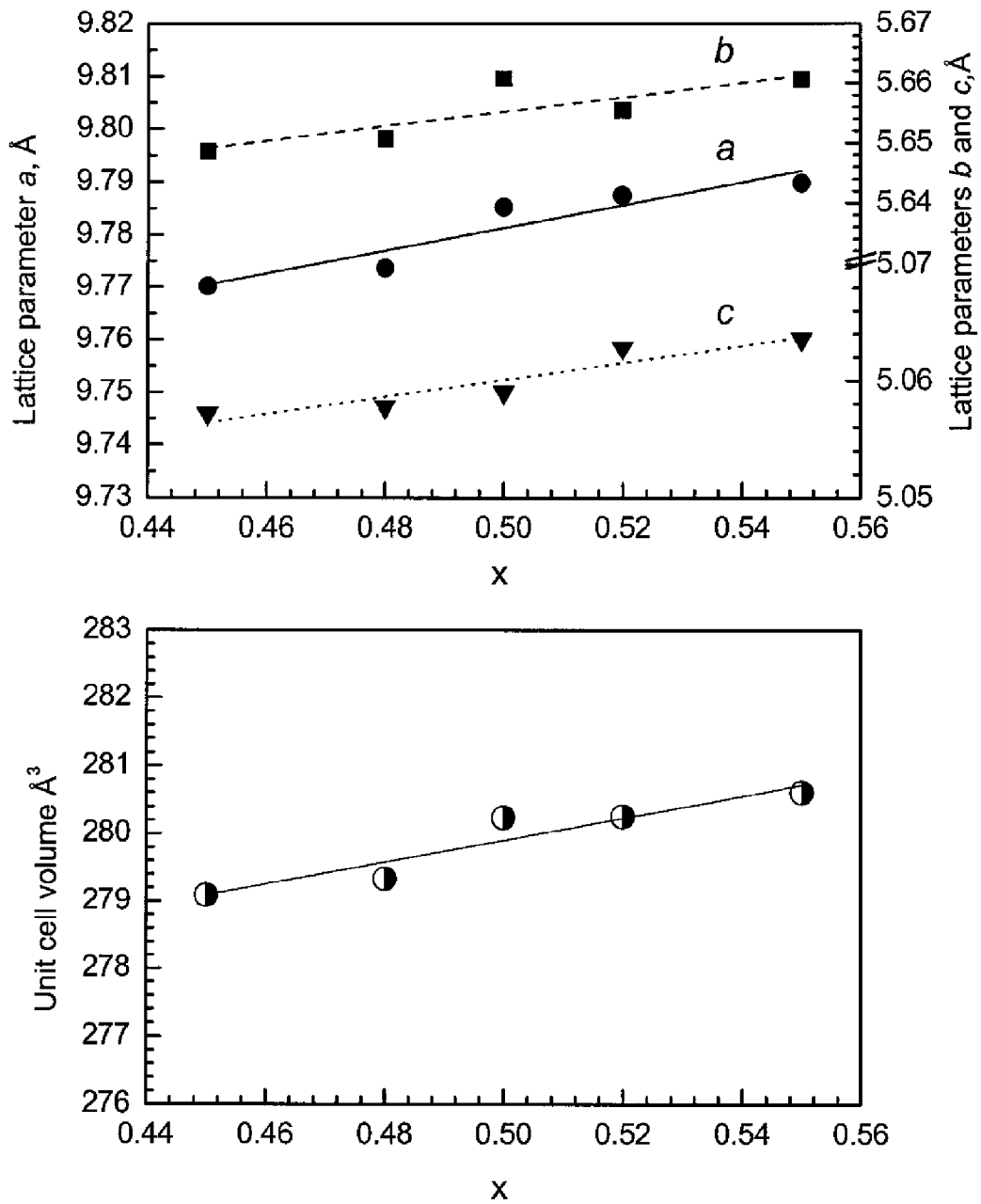
FIG. 8 depicts the lattice parameters of phosphors expressed by the formulation $Ca_{1-x}Al_{x-xy}Si_{1-x+xy}N_{2-x-xy}C_{xy}$:$Eu^{2+}$ (y=0.05, Eu=1 mol %) as a function of x for sample preparations 1.6 through 1.10.

Phosphor samples were prepared according to the process described in Example 1(a) using the starting materials and weights listed in Table 6. The product is expressed by the formulation of $Ca_{1-x}Al_{x-xy}Si_{1-x+xy}N_{2-x-xy}C_{xy}$:$Eu^{2+}$. In these preparations, the x value was systematically increased from 0.45 to 0.6 and the y value was fixed at 0.05. This change lead to a variation of $[Al]^{3+}/[Si]^{4+}$ ratio from about 0.81 to about 1.54 across the preparations. When the carbon content is nearly fixed, the unit cell volume increases as the x value increases (i.e. $[Al]^{3+}/[Si]^{4+}$ ratio increases). This is ascribed to the fact that the bond length of Al—N (or Al—C) is longer than that of Si—N (or Si—C), and is demonstrated by the changes of the crystal unit cell parameters shown in Table 8 and FIG. 8 where the lattice parameters a, b, and c of $Ca_{1-x}Al_{x-xy}Si_{1-x+xy}N_{2-x-xy}C_{xy}$:$Eu^{2+}$ (y=0.05, Eu=1 mol %) increase as the value of x increases. Additionally, from the body color and the fluorescence emission data (Table 7) it is seen that the change of x value affects the luminescence efficiency of the phosphors.

TABLE 6

Starting materials and formula parameters of phosphors $Ca_{1-x}Al_{x-xy}Si_{1-x+xy}N_{2-x-xy}C_{xy}$: $Eu^{2+}$

| | $Ca_{1-x}Al_{x-xy}Si_{1-x+xy}N_{2-x-xy}C_{xy}$: $Eu^{2+}$ | | | | | Formula parameters | | |
|---|---|---|---|---|---|---|---|---|
| Sample ID | $Ca_3N_2$ | AlN | $Si_3N_4$ | EuN | SiC | x | y | xy |
| 1.6 | 1.1221 | 0.7307 | 1.0725 | 0.0381 | 0.0376 | 0.45 | 0.05 | 0.023 |
| 1.7 | 1.0853 | 0.7978 | 1.0380 | 0.0390 | 0.0411 | 0.48 | 0.05 | 0.024 |
| 1.8 | 1.0334 | 0.8924 | 0.9892 | 0.0402 | 0.0460 | 0.52 | 0.05 | 0.026 |
| 1.9 | 0.9922 | 0.9674 | 0.9505 | 0.0412 | 0.0498 | 0.55 | 0.05 | 0.028 |
| 1.10 | 0.9610 | 1.0350 | 0.9187 | 0.0330 | 0.0533 | 0.575 | 0.05 | 0.029 |
| 1.11 | 0.9247 | 1.1040 | 0.8839 | 0.0314 | 0.0568 | 0.60 | 0.05 | 0.030 |

TABLE 7

Fluorescence characteristics of phosphors
$Ca_{1-x}Al_{x-xy}Si_{1-x+xy}N_{2-x-xy}C_{xy}$: $Eu^{2+}$

| | Fluorescence Characteristics | | |
|---|---|---|---|
| Sample ID | QE | Peak (nm) | Peak FWHM |
| 1.6 | 66.8 | 658 | 92 |
| 1.7 | 84.3 | 658 | 90 |
| 1.8 | 82.2 | 659 | 86 |
| 1.9 | 89.2 | 654 | 87 |
| 1.10 | 85.5 | 656 | 91 |
| 1.11 | 89.3 | 661 | 90 |

TABLE 8

Lattice parameters of $Ca_{1-x}Al_{x-xy}Si_{1-x+xy}N_{2-x-xy}C_{xy}$:
$Eu^{2+}$ (y = 0.05, Eu = 1 mol %)

| Sample ID | x | a(Å) | b(Å) | c(Å) | Unit cell volume (Å³) |
|---|---|---|---|---|---|
| 1.6 | 0.45 | 9.77023 | 5.64858 | 5.05715 | 279.09 |
| 1.7 | 0.48 | 9.77368 | 5.65075 | 5.05775 | 279.33 |
| 1.3 | 0.50 | 9.78524 | 5.66069 | 5.05903 | 280.23 |
| 1.8 | 0.52 | 9.78749 | 5.65553 | 5.06285 | 280.25 |
| 1.9 | 0.55 | 9.78975 | 5.66062 | 5.06356 | 280.60 |
| 1.10 | 0.575 | 9.80960 | 5.65424 | 5.06092 | 280.71 |
| 1.11 | 0.60 | 9.80967 | 5.65392 | 5.06223 | 280.77 |

Example 2

The Preparation of Phosphors of Formulation (2)

Figure 9:
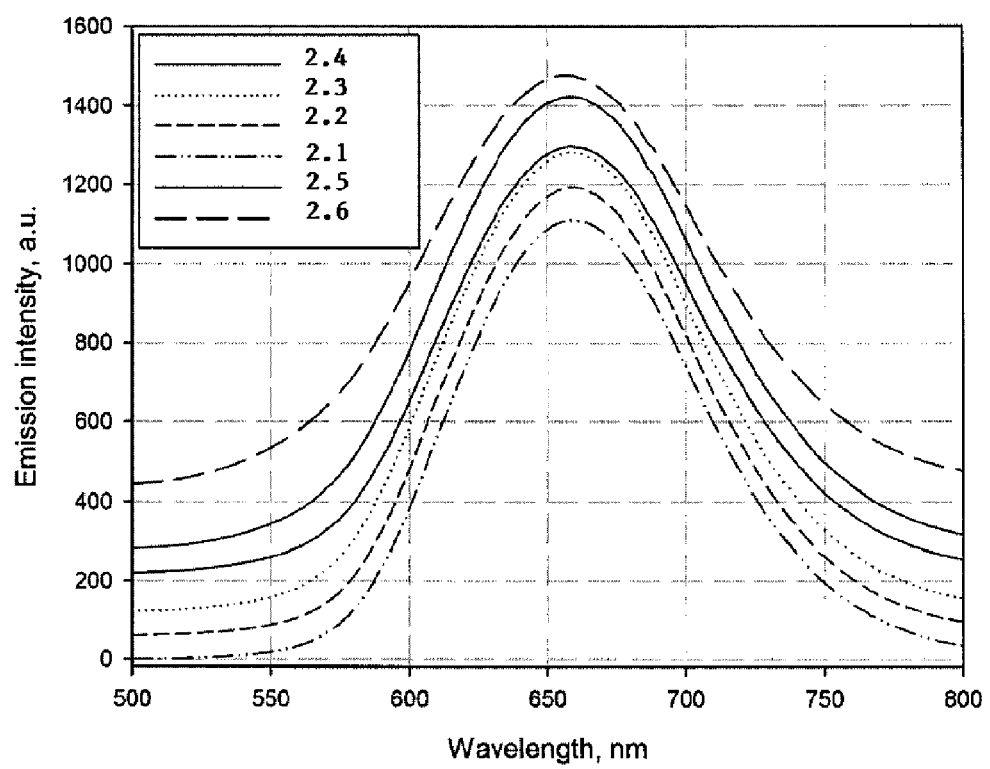
FIG. 9 depicts the fluorescence emission spectra of phosphors of formulation (2) with the excitation of 460 nm.
Figure 10:
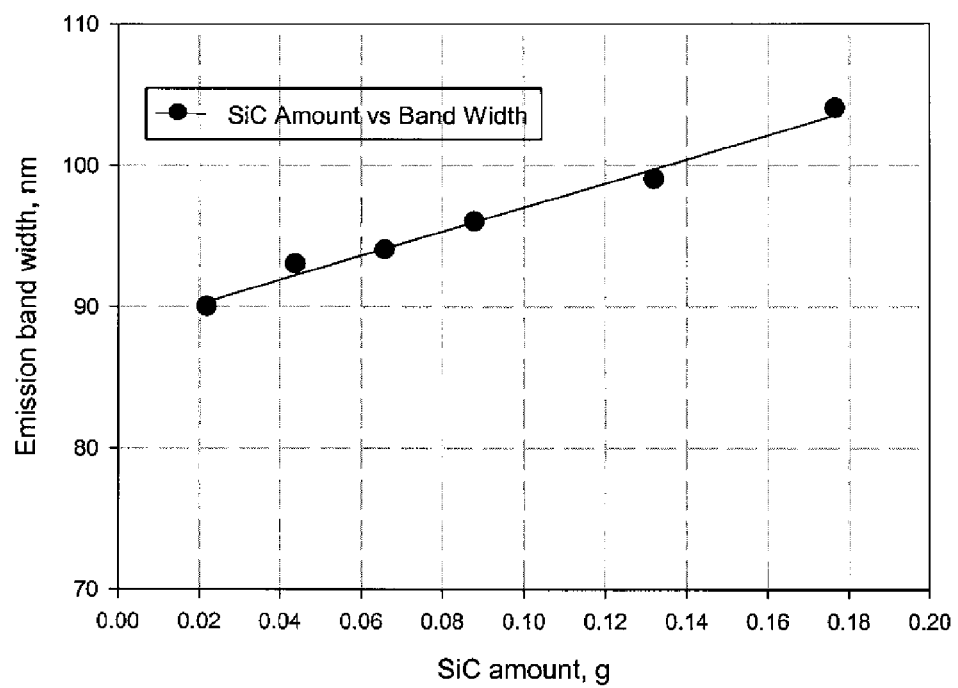
FIG. 10 depicts the dependence of the emission band width of phosphors of formulation (2) on the amount of SiC added to each phosphor's preparation.
Figure 11:
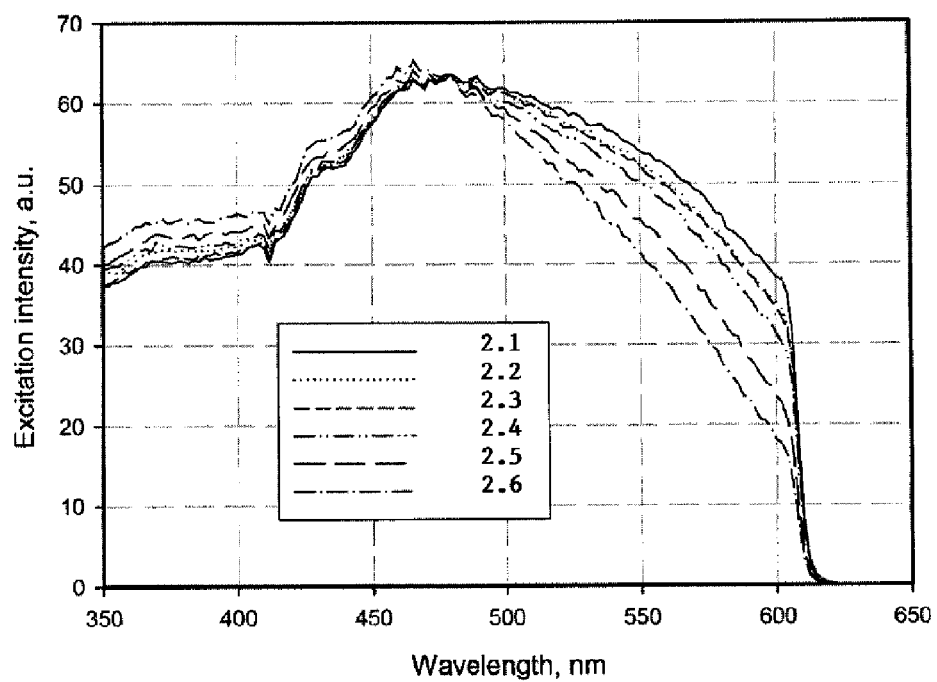
FIG. 11 depicts the fluorescence excitation profiles of phosphors of formulation (2). The fluorescence was monitored at 650 nm.
Figure 12:
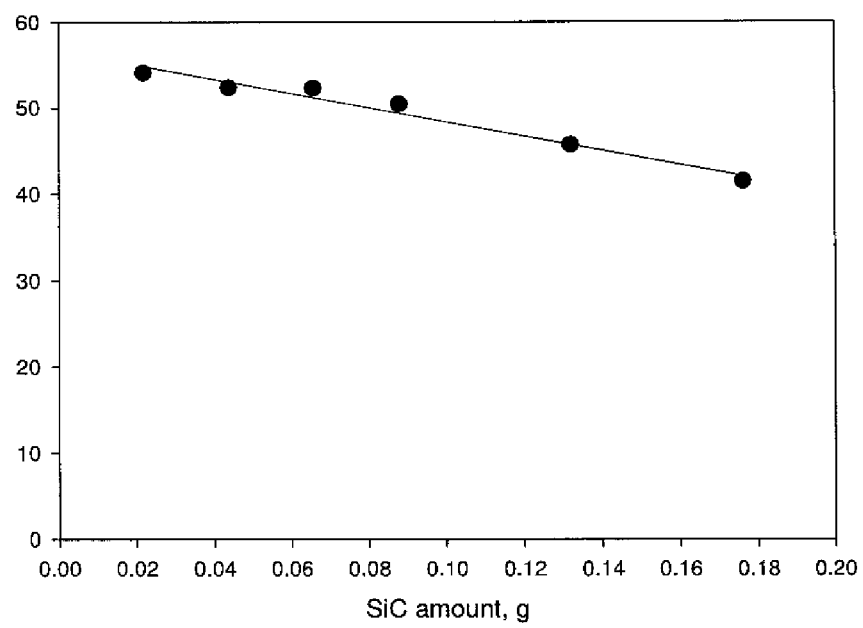
FIG. 12 depicts the dependence of the emission intensity excited at 550 nm of phosphors of formulation (2) on the amount of SiC added to each phosphor's preparation. The emission was monitored at 650 nm.
Figure 13:
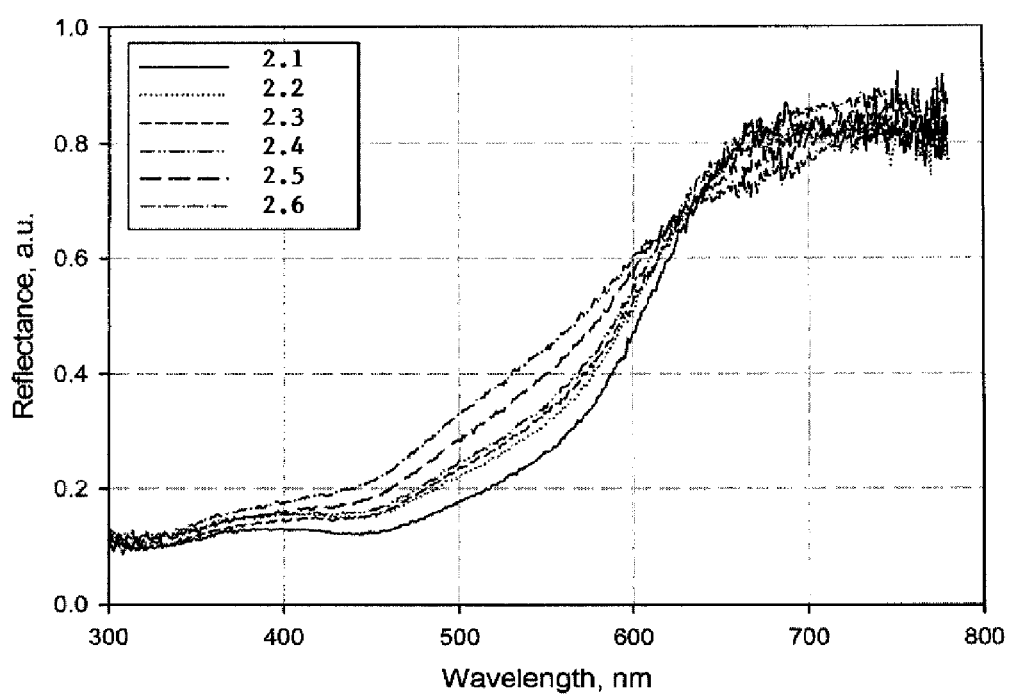
FIG. 13 depicts the optical reflectance of phosphors of formulation (2).
Figure 14:
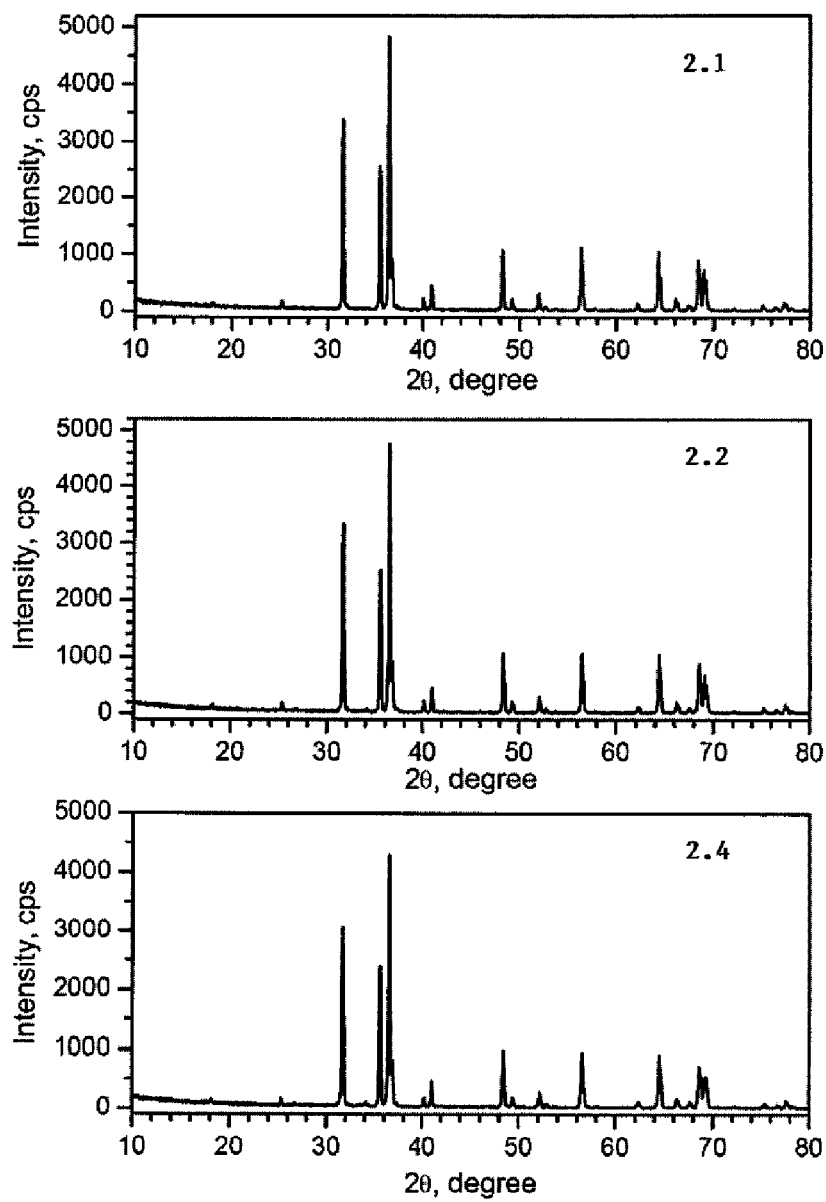
FIG. 14 depicts the X-ray powder diffraction patterns of phosphors of formulation (2).
Figure 15:
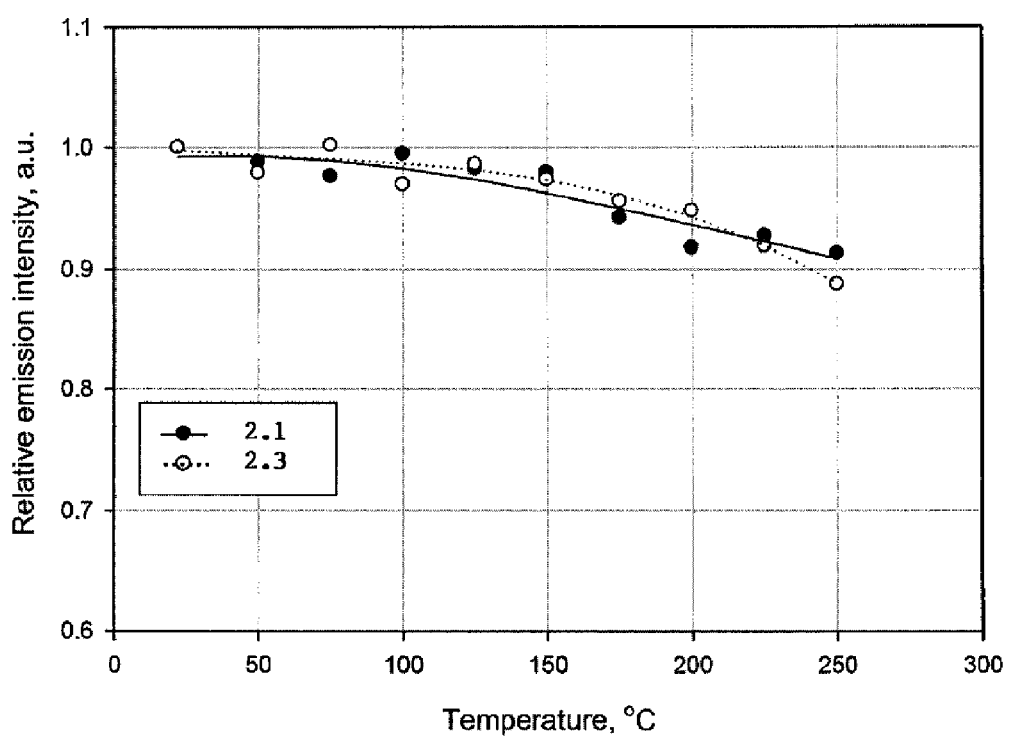
FIG. 15 depicts the temperature dependence of the emission intensity of phosphors of formulation (2).

Powders of $Ca_3N_2$, AlN, BN, $Si_3N_4$, EuN, SiC and metal Na were mixed in a designed ratio as set forth in Table 9 with a mortar and pestle under the protection of $N_2$ atmosphere. The mixture was then loaded in a firing boat or crucible and was fired at 1600° C. for 6 hours under $N_2/H_2$ atmosphere. The product powder was then ground and sieved. The product is the formulation of $Ca_{1-x-z}Na_zM(III)_{x-xy-z}Si_{1-x+xy+z}N_{2-x-xy}C_{xy}$:Eu, M(III)=(Al, B). This phosphor emits a red light under blue or nUV light excitation (FIG. 9). The emission band width increases with the increase of the added SiC amount (FIG. 10), indicating a carbide effect on the fluorescence properties. The phosphors are excited by a light of wavelength from 350 nm to 610 nm, and more efficiently excited by a light of wavelength from 420 nm to 550 nm (FIG. 11). As depicted in FIG. 12, when the phosphors are excited by a green light, for example, at 550 nm, the emission intensity drops as the added amount of SiC increases. As shown in FIG. 13, the optical reflectance of the phosphors in the wavelength range from 460 nm to 620 nm shows a gradual increase as the amount of SiC is increased. The XRD patterns are shown in FIG. 14. The crystal structure data is listed in Table 10. The temperature dependence of the emission intensity is shown in FIG. 15.

TABLE 9

Starting materials (gram) for phosphors of formulation (2).

| | $Ca_{1-x-z}Na_zM(III)_{x-xy-z}Si_{1-x+xy+z}N_{2-x-xy}C_{xy}$: Eu, M(III) = (Al, B) | | | | | | | Luminescence Characteristics | | |
|---|---|---|---|---|---|---|---|---|---|---|
| Sample ID | $Ca_3N_2$ | AlN | $Si_3N_4$ | BN | Na | EuN | SiC | QE, % | $\lambda_{em}$, nm | FWHM, nm |
| 2.1 | 1.0197 | 0.7873 | 1.0779 | 0.0272 | 0.0252 | 0.0364 | 0.0220 | 93.2 | 660 | 90 |
| 2.2 | 1.0199 | 0.7650 | 1.0781 | 0.0272 | 0.0252 | 0.0364 | 0.0440 | 93.5 | 658 | 93 |
| 2.3 | 1.0201 | 0.7426 | 1.0782 | 0.0273 | 0.0252 | 0.0364 | 0.0660 | 93 | 655 | 94 |
| 2.4 | 1.0202 | 0.7202 | 1.0784 | 0.0273 | 0.0252 | 0.0365 | 0.0881 | 88.9 | 662 | 96 |
| 2.5 | 1.0206 | 0.6754 | 1.0788 | 0.0273 | 0.0253 | 0.0365 | 0.1321 | 81.2 | 658 | 99 |
| 2.6 | 1.0209 | 0.6306 | 1.0791 | 0.0273 | 0.0253 | 0.0365 | 0.1763 | 73.8 | 650 | 104 |
| 2.7 | 0.9717 | 0.6792 | 1.1364 | 0.0274 | 0.0508 | 0.0367 | 0.0886 | 83.7 | 654 | 100 |

TABLE 10

Crystallographic data of a phosphor
$Ca_{0.47}Na_{0.025}Al_{0.35}B_{0.025}Si_{0.6}N_{1.425}C_{0.075}$: $Eu^{2+}$
of formulation (2) (sample ID 2.5).

| Crystal system | Orthorhombic |
|---|---|
| Space group | $Cmc2_1$ (36) |
| Lattice parameters (Å) | a = 9.7232(2) |
| | b = 5.6287(1) |
| | c = 5.0322(6) |
| Unit cell volume (Å³) | V = 275.41(1) |
| Z | 8 |
| $R_{wp}$ | 5.94% |
| $R_p$ | 4.12% |
| $\chi^2$ | 7.6 |

| Atom | x/a | y/b | c/z | $U_{iso}$ x 100 | S.O.F. |
|---|---|---|---|---|---|
| Ca1 | 0 | 0.3220(3) | 0.4964 | 1.90 | 0.94 |
| Na1 | 0 | 0.3220(3) | 0.4964 | 1.90 | 0.05 |
| Eu1 | 0 | 0.3220(3) | 0.4964 | 1.90 | 0.01 |
| Al1 | 0.1732(2) | 0.1564(3) | 0.0227(5) | 0.17 | 0.35 |
| B1 | 0.1732(2) | 0.1564(3) | 0.0227(5) | 0.17 | 0.02 |
| Si1 | 0.1732(2) | 0.1564(3) | 0.0227(5) | 0.17 | 0.60 |
| N1 | 0.2183(4) | 0.1316(8) | 0.3742(5) | 0.19 | 0.95 |
| C1 | 0.2183(4) | 0.1316(8) | 0.3742(5) | 0.19 | 0.05 |
| N2 | 0 | 0.2495(9) | 0.9723(11) | 0.11 | 0.95 |
| C2 | 0 | 0.2495(9) | 0.9723(11) | 0.11 | 0.05 |

Example 3

The Preparation of Phosphors of Formulation (3)

Figure 16:
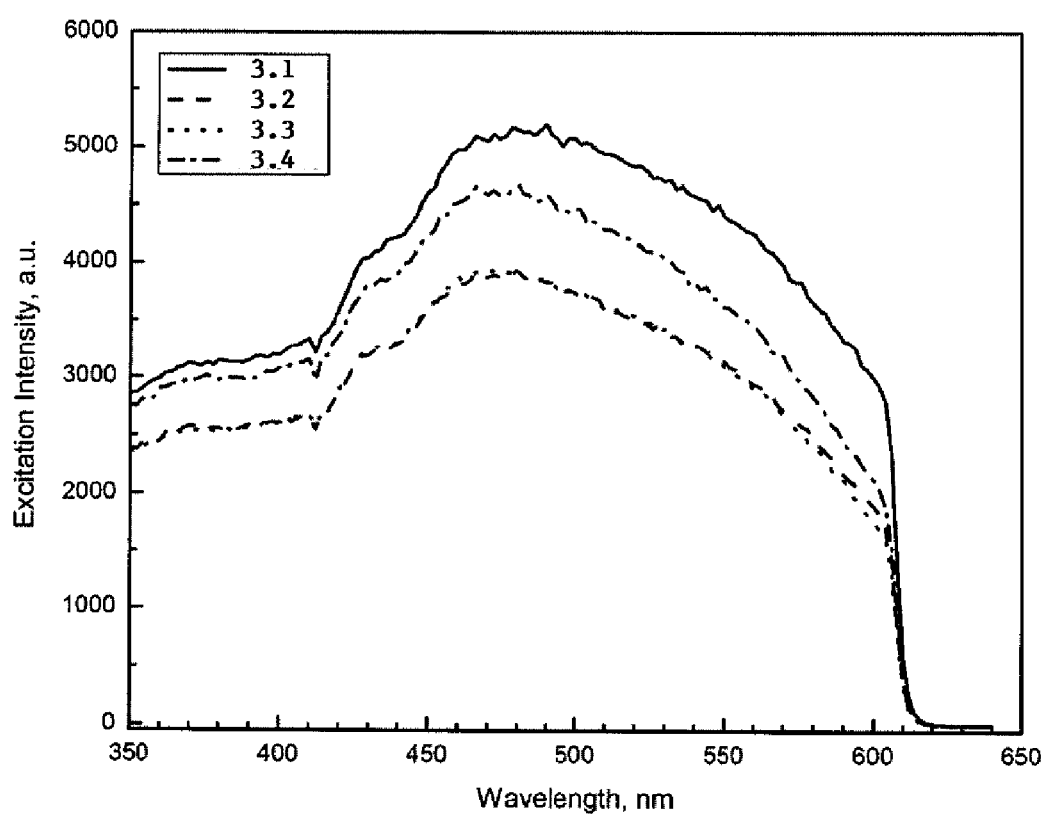
FIG. 16 depicts the fluorescence excitation profiles of phosphors of formulation (3). The fluorescence was monitored at 650 nm.
Figure 17:
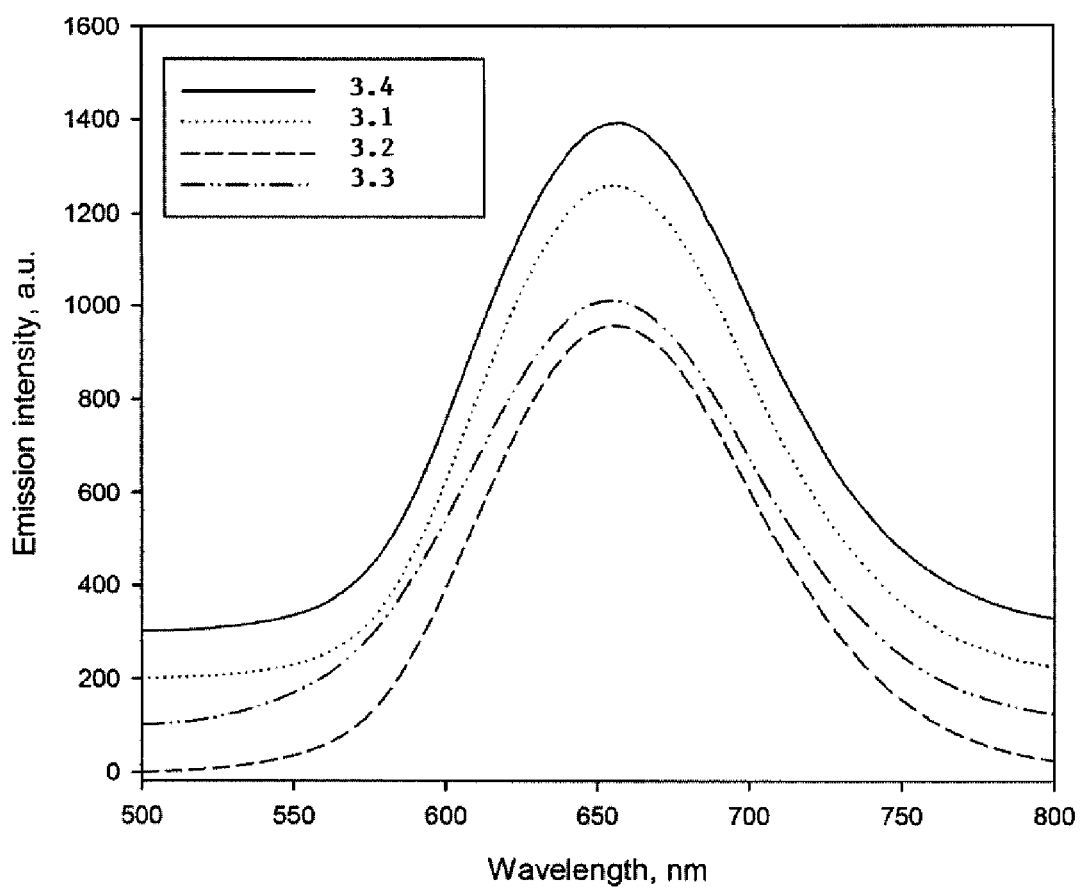
FIG. 17 depicts the fluorescence emission spectra of phosphor samples of formulation (3) with the excitation of 460 nm.
Figure 18:
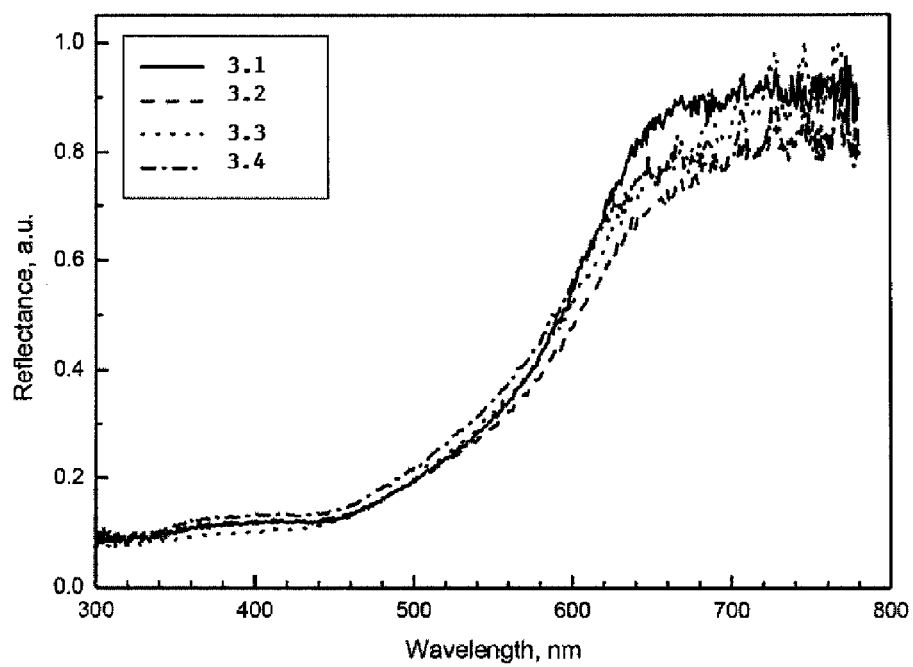
FIG. 18 depicts the reflectance spectra of phosphors of formulation (3).
Figure 19:
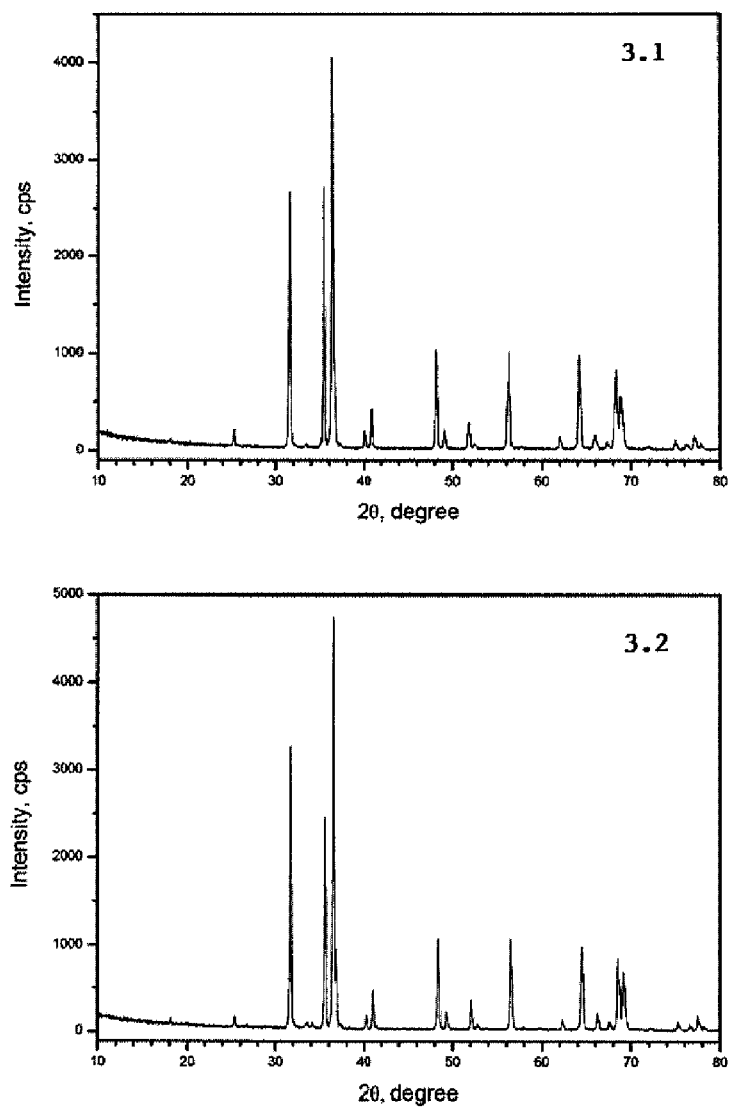
FIG. 19 depicts the X-ray powder diffraction patterns of phosphors of formulation (3).
Figure 20:
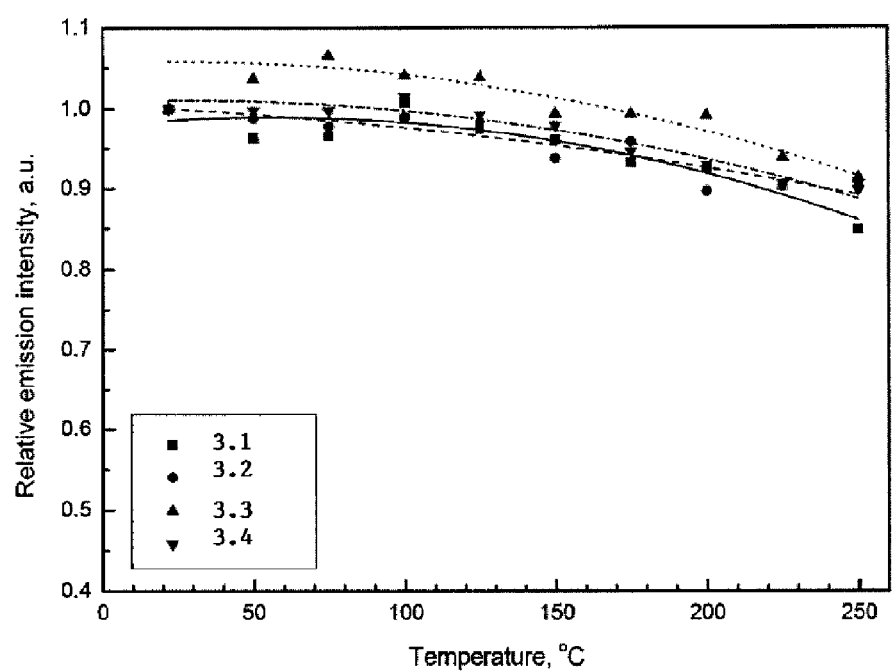
FIG. 20 depicts the temperature dependence of the emission intensity of phosphors of formulation (3).

Powders of $Ca_3N_2$, AlN, BN, $Si_3N_4$, EuN, SiC and $Li_3N$ were mixed in a designed ratio as given in Table 11 with a mortar and pestle under the protection of $N_2$ atmosphere. The mixture was then loaded in a firing boat or crucible and was fired at 1600° C. for 6 hours under $N_2/H_2$ atmosphere. The product powder was then ground and sieved. The product is expressed by the formulation of $Ca_{1-x-z}Li_zM(III)_{x-xy-z}Si_{1-x+xy+z}N_{2-x-xy}C_{xy}$:Eu, M(III)=(Al, B). The phosphors of this formulation are excited by light of wavelength 350 nm to 610 nm (FIG. 16). This phosphor emits a red light under blue or nUV light excitation (FIG. 17). The reflectance spectra of the phosphors are illustrated in FIG. 18. The typical X-ray powder diffraction patterns are shown in FIG. 19. Similar to Examples 1 and 2, the obtained phosphors can be indexed to be either orthorhombic or monoclinic system. In addition, this kind of phosphor has high thermal stability as indicated in FIG. 20 for the temperature dependence of the emission intensity.

TABLE 11

Starting materials (grams) and luminescence characteristics for phosphors of formulation (3).

| Sample ID | $Ca_{1-x-z}Li_zM(III)_{x-xy-z}Si_{1-x+xy+z}N_{2-x-xy}C_{xy}$:Eu, M(III) = (Al, B) | | | | | | | Luminescence Characteristics | | |
|---|---|---|---|---|---|---|---|---|---|---|
| | $Ca_3N_2$ | AlN | $Si_3N_4$ | BN | $Li_3N$ | EuN | SiC | QE, % | $\lambda_{em}$, nm | FWHM, nm |
| 3.1 | 1.0259 | 0.7695 | 1.0844 | 0.0274 | 0.0128 | 0.0367 | 0.0443 | 75.3 | 663 | 91 |
| 3.2 | 1.0263 | 0.7245 | 1.0848 | 0.0274 | 0.0128 | 0.0367 | 0.0886 | 70.2 | 655 | 92 |
| 3.3 | 0.9833 | 0.6873 | 1.1500 | 0.0277 | 0.0260 | 0.0371 | 0.0896 | 67.2 | 656 | 97 |
| 1.2 | 1.0617 | 0.8450 | 1.0148 | 0 | 0 | 0.0360 | 0.0435 | 80 | 662 | 87 |
| 3.4 | 1.0202 | 0.7652 | 1.0784 | 0 | 0.0127 | 0.0365 | 0.0881 | 88.7 | 657 | 95 |

Example 4

The Preparation of the Phosphors of Formulation (3)

Powders of $Ca_3N_2$, AlN, BN, $Si_3N_4$, EuN, SiC and metal K were mixed in a designed ratio as set forth in Table 12 with a mortar and pestle under the protection of $N_2$ atmosphere. The mixture was then loaded in a firing boat or crucible and was fired at 1600° C. for 6 hours under $N_2/H_2$ atmosphere. The product powder was then ground and sieved. The product is expressed by the formulation of $Ca_{1-x-z}K_zM(III)_{x-xy-z}Si_{1-x+xy+z}N_{2-x-xy}C_{xy}$:Eu, M(III)=(Al, B). The phosphors emit red light under blue or nUV light excitation with high quantum efficiency (Table 12). Moreover, this red emitting phosphor possesses high thermal stability resulted from both carbide and K incorporation.

TABLE 12

Starting materials (grams) and luminescence characteristics for phosphors of formulation (3).

| Sample ID | $Ca_{1-x-z}K_zM(III)_{x-xy-z}Si_{1-x+xy+z}N_{2-x-xy}C_{xy}$:Eu, M(III) = (Al, B) | | | | | | | Luminescence Characteristics | | |
|---|---|---|---|---|---|---|---|---|---|---|
| | $Ca_3N_2$ | AlN | $Si_3N_4$ | BN | K | EuN | SiC | QE, % | $\lambda_{em}$, nm | FWHM, nm |
| 3.5 | 1.0139 | 0.7605 | 1.0718 | 0.0271 | 0.0427 | 0.0362 | 0.0438 | 90 | 662 | 94 |
| 3.6 | 1.0143 | 0.7160 | 1.0721 | 0.0271 | 0.0427 | 0.0362 | 0.0876 | 83.2 | 653 | 95 |
| 3.7 | 0.9060 | 0.6710 | 1.1737 | 0.0271 | 0.1280 | 0.0362 | 0.0438 | 80 | 651 | 104 |
| 3.8 | 0.9063 | 0.6264 | 1.1741 | 0.0271 | 0.1281 | 0.0363 | 0.0875 | 78.7 | 650 | 106 |

Example 5

Preparation of Phosphors of Formulation (4)

Figure 21:
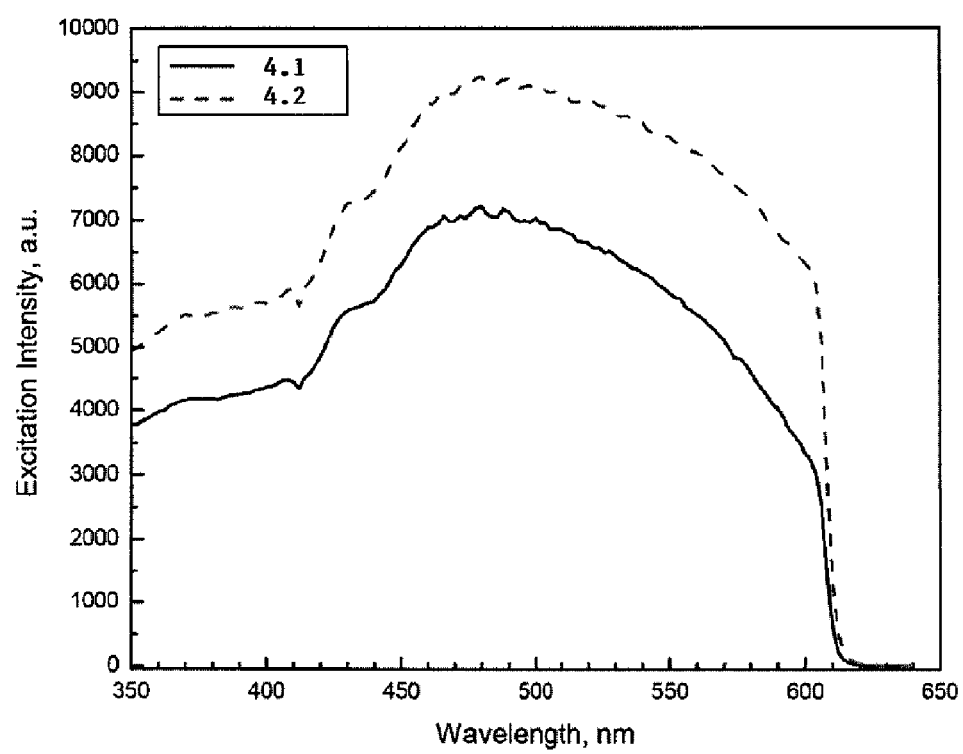
FIG. 21 depicts the fluorescence excitation profiles of phosphors of formulation (4). The fluorescence was monitored at 650 nm.
Figure 22:
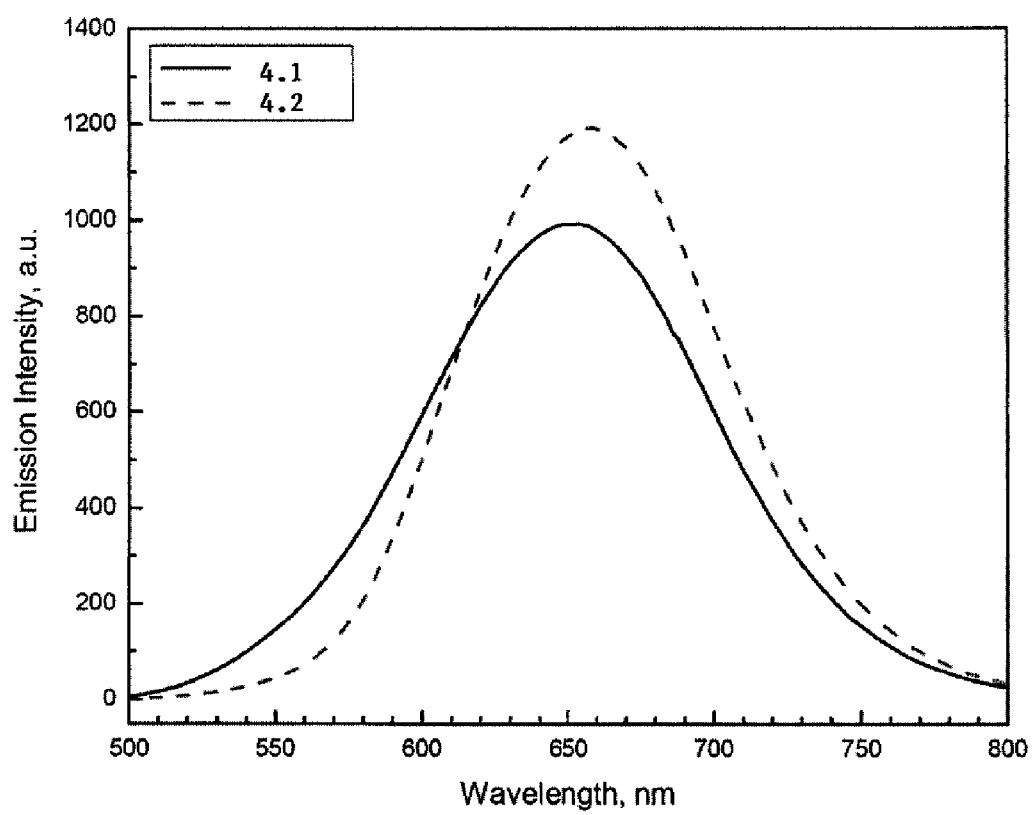
FIG. 22 depicts the fluorescence emission spectra of phosphor samples of formulation (4) with an excitation of 460 nm.
Figure 23:
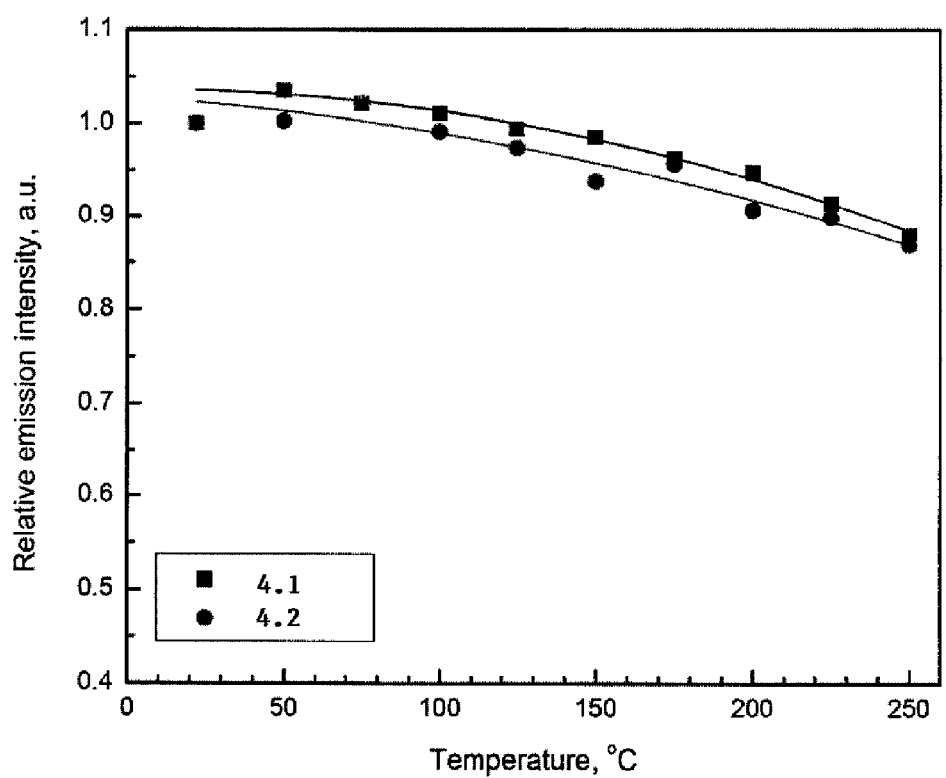
FIG. 23 depicts the temperature dependence of the emission intensity of phosphors of formulation (4).

Powders of $Ca_3N_2$, AlN, BN, $Si_3N_4$, metal Na, EuN, SiC, $CaF_2$ and $SiO_2$ were mixed in a designed ratio as set forth in Table 13 with a mortar and pestle under the protection of $N_2$ atmosphere. The mixture was then loaded in a firing boat or crucible and was fired at 1600° C. for 6 hours under $N_2/H_2$ atmosphere. The product powder was then ground and sieved. The product is expressed by the formulation of $Ca_{1-x-z}Na_z(AlB)_{x-xy-z}Si_{1-x+xy+z}N_{2-x-xy-2w/3}C_{xy}O_{w-v/2}H_v$:Eu. This phosphor emits a red light under blue or nUV light excitation (FIGS. 21 and 22) with high thermal stability and high quantum efficiency of luminescent emission (FIG. 23 and Table 13).

TABLE 13

Starting materials (grams) and luminescence characteristics for phosphors of formulation (4).

| Sample ID | $Ca_{1-x-z}Na_z(AlB)_{x-xy-z}Si_{1-x+xy+z}N_{2-x-xy-2w/3}C_{xy}O_{w-v/2}H_v$: Eu | | | | | | | | | Luminescence Characteristics | | |
|---|---|---|---|---|---|---|---|---|---|---|---|---|
| | $Ca_3N_2$ | AlN | $Si_3N_4$ | BN | Na | EuN | SiC | $CaF_2$ | $SiO_2$ | QE, % | $\lambda_{em}$, nm | FWHM, nm |
| 4.1 | 0.9537 | 0.6761 | 1.1121 | 0.0273 | 0.0506 | 0.0365 | 0.0882 | 0.0215 | 0.0248 | 76.9 | 640 | 101 |
| 4.2 | 1.0019 | 0.7616 | 1.0541 | 0.0271 | 0.0251 | 0.0363 | 0.0438 | 0.0213 | 0.0246 | 92.5 | 653 | 93 |

Example 6

Preparation of Phosphors of Formulation 4(a)

Powders of $Ca_3N_2$, AlN, BN, $Si_3N_4$, metal Na and K, $Li_3N$, EuN, SiC, $CaF_2$ and $SiO_2$ were mixed in a designed ratio as set forth in Tables 14, 15 and 16 with a mortar and pestle under the protection of $N_2$ atmosphere. The mixture was then loaded in a firing boat or crucible and was fired at 1600° C. for 6 hours under $N_2/H_2$ atmosphere. The product powder was then ground and sieved. The product is the formulation of $Ca_{1-x-z}M(I)_z(AlB)_{x-xy-z}Si_{1-x+xy+z}N_{2-x-xy-2w/3-v/3}C_{xy}O_wH_v$:Eu (M(I)=Li, Na, K). This phosphor emits a red light under blue or nUV light excitation with high thermal stability and high quantum efficiency of luminescent emission. The starting materials and luminescence characteristics of these preparations are set forth in Tables 14-16.

TABLE 14

Starting materials (grams) and luminescence characteristics for phosphors of formulation (4a).

| Sample ID | $Ca_{1-x-z}Na_z(AlB)_{x-xy-z}Si_{1-x+xy+z}N_{2-x-xy-2w/3-v/3}C_{xy}O_wH_v$: Eu | | | | | | | | | Luminescence Characteristics | | |
|---|---|---|---|---|---|---|---|---|---|---|---|---|
| | $Ca_3N_2$ | AlN | $Si_3N_4$ | BN | Na | EuN | SiC | $CaF_2$ | $SiO_2$ | QE, % | $\lambda_{em}$, nm | FWHM, nm |
| 4.3 | 0.9881 | 0.7390 | 1.0474 | 0.0407 | 0.0251 | 0.0363 | 0.0438 | 0.0427 | 0.0328 | 82.2 | 649 | 95 |
| 4.4 | 0.9964 | 0.7000 | 1.0820 | 0.0410 | 0.0380 | 0.0366 | 0.0663 | 0.0000 | 0.0331 | 73.8 | 647 | 96 |
| 4.5 | 0.9876 | 0.7610 | 1.0724 | 0.0271 | 0.0251 | 0.0363 | 0.0438 | 0.0426 | 0.0000 | 89.3 | 653 | 94 |

TABLE 15

Starting materials (grams) and luminescence characteristics for phosphors of formulation (4a).

| Sample ID | $Ca_{1-x-z}Li_z(AlB)_{x-xy-z}Si_{1-x+xy+z}N_{2-x-xy-2w/3-v/3}C_{xy}O_wH_v$: Eu | | | | | | | | | Luminescence Characteristics | | |
|---|---|---|---|---|---|---|---|---|---|---|---|---|
| | $Ca_3N_2$ | AlN | $Si_3N_4$ | BN | $Li_3N$ | EuN | SiC | $CaF_2$ | $SiO_2$ | QE, % | $\lambda_{em}$, nm | FWHM, nm |
| 4.6 | 0.9910 | 0.7636 | 1.0505 | 0.0272 | 0.0127 | 0.0364 | 0.0439 | 0.0428 | 0.0329 | 86.3 | 658 | 94 |
| 4.7 | 1.0021 | 0.7494 | 1.0882 | 0.0275 | 0.0193 | 0.0368 | 0.0444 | 0.0000 | 0.0333 | 64.5 | 653 | 94 |
| 4.8 | 0.9934 | 0.7655 | 1.0787 | 0.0273 | 0.0128 | 0.0365 | 0.0440 | 0.0429 | 0.0000 | 90.6 | 656 | 97 |

TABLE 16

Starting materials (grams) and luminescence characteristics for phosphors of formulation (4a).

| Sample ID | $Ca_{1-x-z}K_z(AlB)_{x-xy-z}Si_{1-x+xy+z}N_{2-x-xy-2w/3-v/3}C_{xy}O_wH_v$: Eu | | | | | | | | | Luminescence Characteristics | | |
|---|---|---|---|---|---|---|---|---|---|---|---|---|
| | $Ca_3N_2$ | AlN | $Si_3N_4$ | BN | K | EuN | SiC | $CaF_2$ | $SiO_2$ | QE, % | $\lambda_{em}$, nm | FWHM, nm |
| 4.9 | 0.9875 | 0.7161 | 1.0723 | 0.0406 | 0.0640 | 0.0362 | 0.0438 | 0.0000 | 0.0328 | 78.1 | 645 | 95 |
| 4.10 | 0.9824 | 0.7347 | 1.0413 | 0.0404 | 0.0425 | 0.0361 | 0.0436 | 0.0424 | 0.0326 | 89.9 | 653 | 95 |
| 4.11 | 0.9819 | 0.7565 | 1.0662 | 0.0269 | 0.0425 | 0.0360 | 0.0435 | 0.0424 | 0.0000 | 93.1 | 656 | 94 |

Example 7

Preparation of Carbidonitride pcLED

Several phosphor powders of the present invention were mixed with an encapsulant resin (e.g., a silicone), at 5 wt % phosphor loading amount. The phosphor-filled encapsulant was then injected onto an AlGaN-based, blue-emitting LED chip followed by a curing treatment according to the manufacturer's curing schedule. The emission spectra of the phosphor-converted LEDs are shown in FIG. 31. The luminance properties of the phosphor in the device are listed in Table 17.

TABLE 17

Luminance properties of devices prepared with phosphors of the invention

| Sample ID: | 4.3 | 4.1 | 2.7 | 2.2 |
|---|---|---|---|---|
| Phosphor luminous flux (lm) | 0.740 | 0.800 | 0.673 | 0.597 |
| Phosphor luminous efficacy (lm/elec W) | 11.267 | 12.203 | 10.217 | 9.053 |
| Phosphor conversion efficiency | 79.7% | 77.7% | 75.7% | 82.0% |
| pcLED x | 0.346 | 0.322 | 0.392 | 0.407 |
| pcLED y | 0.160 | 0.156 | 0.190 | 0.176 |
| Phos x | 0.625 | 0.603 | 0.633 | 0.660 |
| Phos y | 0.373 | 0.395 | 0.366 | 0.339 |
| Duv | 0.284 | 0.314 | 0.107 | 0.115 |
| uk | 0.327 | 0.305 | 0.350 | 0.379 |
| vk | 0.227 | 0.222 | 0.253 | 0.246 |

Example 8

Preparation of White Light pcLED

Figure 32:
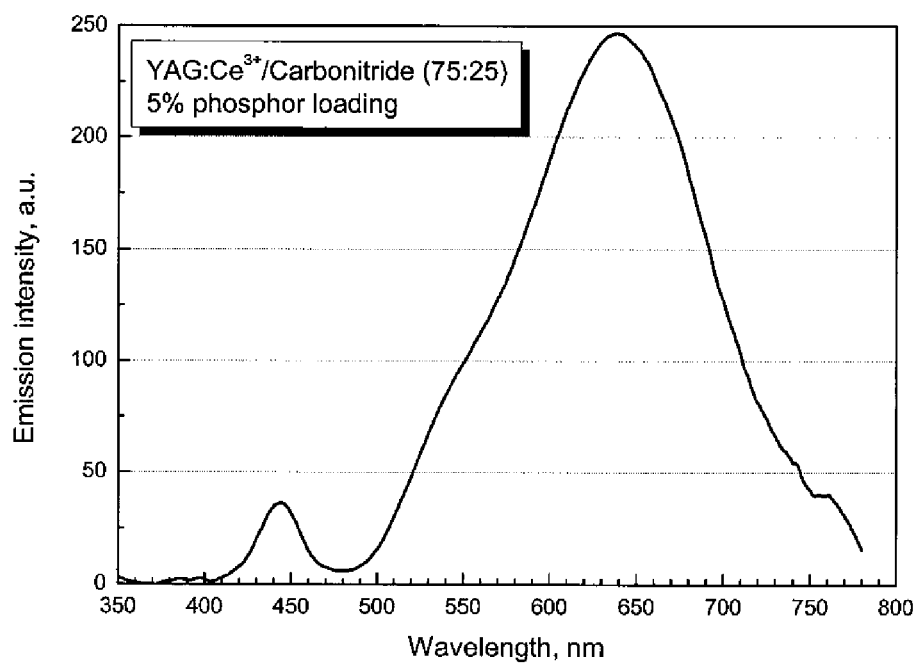
FIG. 32 depicts the emission spectrum of an exemplary white light pcLED of the present invention comprising YAG:Ce and sample no. 2.2.
Figure 33:
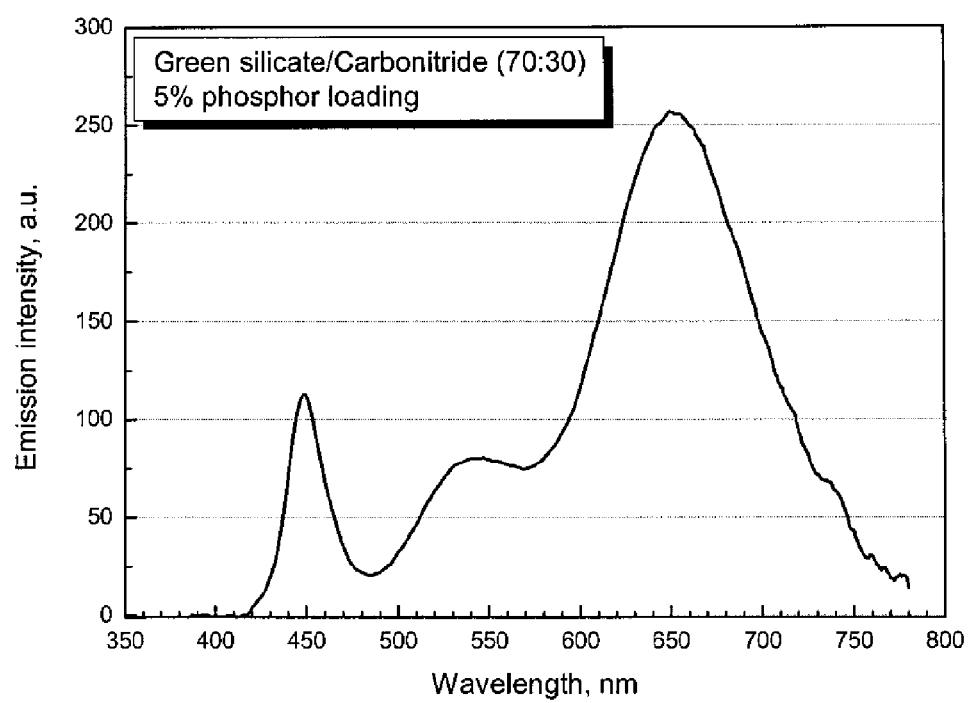
FIG. 33 depicts the emission spectrum of an exemplary white light pcLED of the present invention comprising a green silicate phosphor and sample no 2.2.

A red-emitting carbidonitride phosphor of the present invention, sample no. 2.2, was combined with a second green- or yellow-emitting phosphor (YAG: $Ce^{3+}$ or $(Ca,Sr,Ba)_2SiO_4:Eu^{2+}$) to produce white light. The phosphors used to demonstrate a white light pcLED are listed in Table 18. The phosphor blends were mixed with a silicone resin and were applied to a blue-emitting LED chip by following the procedure described in Example 7. The luminance properties of the pcLED are listed in Table 18. This particular embodiment of the phosphor blend of the instant invention—cerium-doped yttrium aluminum garnet (YAG:Ce)/Carbidonitride—gives a warm white light and its chromaticity coordinates lie very close to the black body locus with a correlated color temperature (CCT) of ~1984 K and color rendering index (CRI) of 86. Higher CRIs may be possible with other exemplary preparations. The emission spectra of the pcLEDs are shown in FIGS. 32 and 33.

TABLE 18

Phosphor blends of Example 8

| | CarbidoNitride (sample ID 2.2) | CarbidoNitride (sample ID 2.2) |
|---|---|---|
| Yellow/Green phosphor | YAG | Silicate |
| Loading in silicone, wt % | 5% | 5% |
| Yellow/Green:Red phosphor ratio, w/w | 75:25 | 70:30 |
| pcLED luminous efficacy (lm/elec W): | 31.275 | 26.065 |
| pcLED x: | 0.506 | 0.422 |
| pcLED y: | 0.408 | 0.331 |
| CRI | 86 | 79 |

Example 9

Preparation of $Ce^{3+}$-doped Carbidonitride Phosphors

Figure 27A:
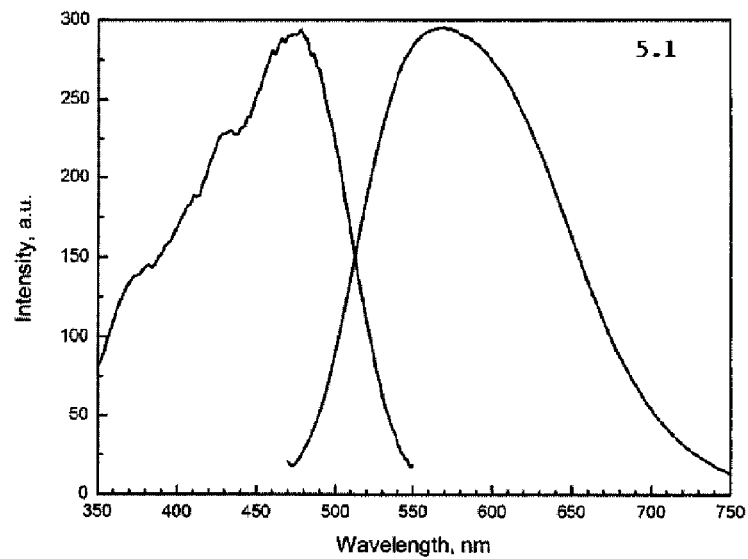
FIGS. 27(a) and 27(b), depict excitation and emission spectra of $Ca_{1-x-z}M(I)_z(AlB)_{x-xy-z}Si_{1-x+xy+z}N_{2-x-xy-2w/3-v/3}O_wC_{xy}H_v$:$Ce^{3+}$,$M(I)^+$ (x=0.5, v=0, Ce=1 mol %) carbidonitride phosphors; (a) M(I)=Li, and (b) M(I)=Na. The emission spectra were monitored at 460 nm and the excitation spectra were monitored at 570 nm.
Figure 27B:
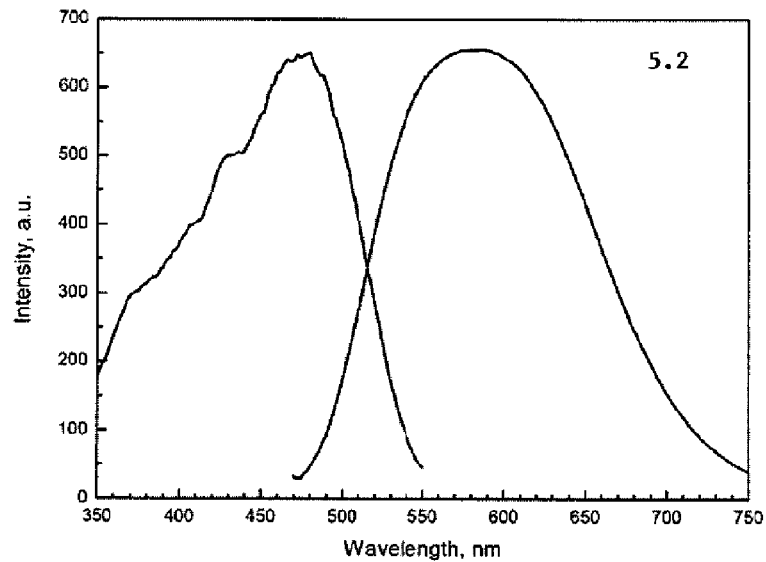
Figure 28:
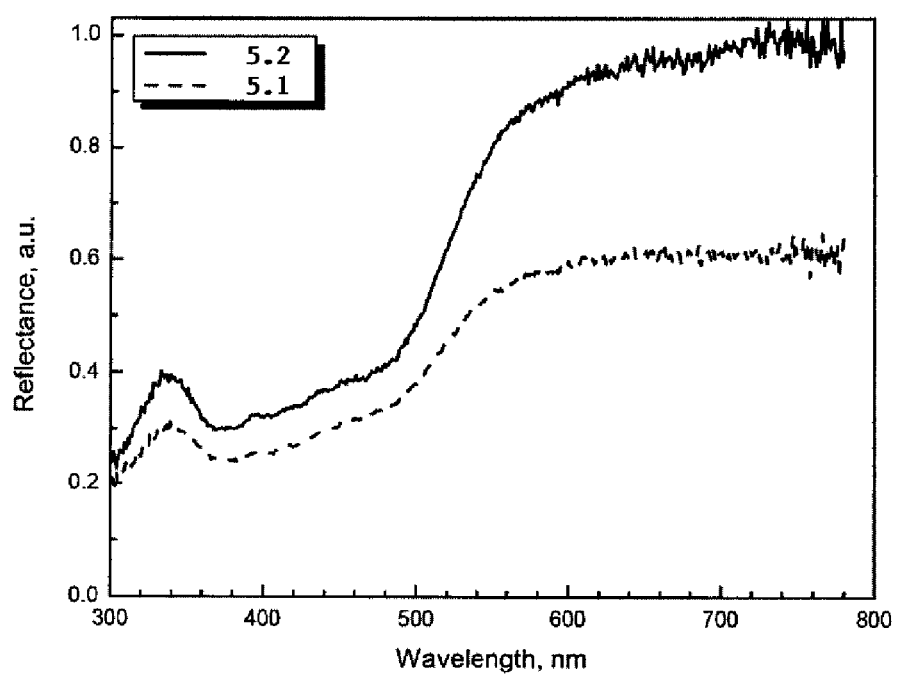
FIG. 28 depicts the optical reflectance spectra of $Ca_{1-x-z}M(I)_z(AlB)_{x-xy-z}Si_{1-x+xy+z}N_{2-x-xy-2w/3-v/3}O_wC_{xy}H_v:Ce^{3+}, M(I)^+$ (x=0.5, v=0, Ce=1 mol %, M(I)=Li, Na) carbidonitride phosphors.
Figure 29:
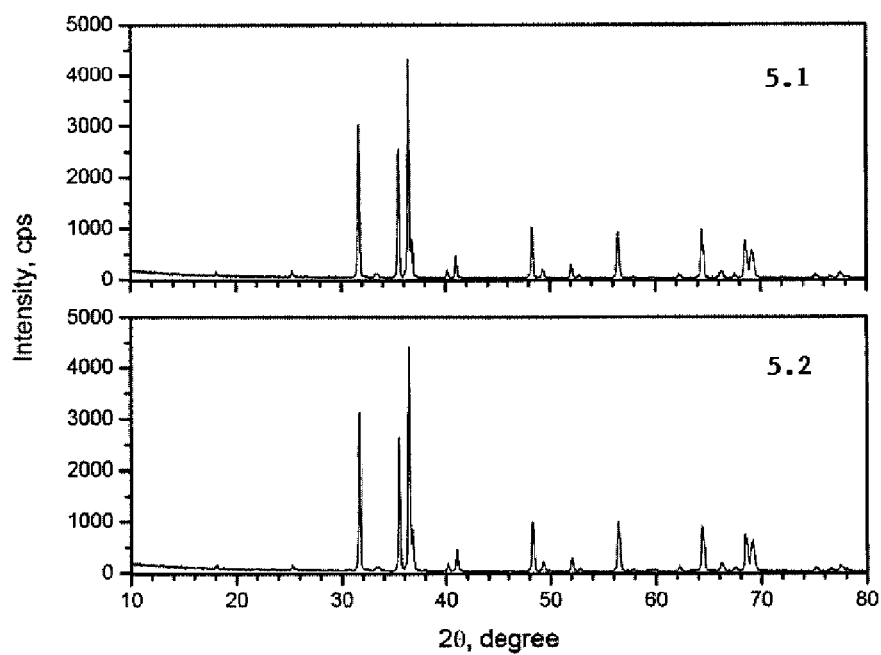
FIG. 29 depicts the X-ray powder diffraction patterns of $Ca_{1-x-z}M(I)_z(AlB)_{x-xy-z}Si_{1-x+xy+z}N_{2-x-xy-2w/3-v/3}O_wC_{xy}H_v:Ce^{3+}, M(I)^+$ (x=0.5, v=0, Ce=1 mol %, M(I)=Li, Na).
Figure 30:
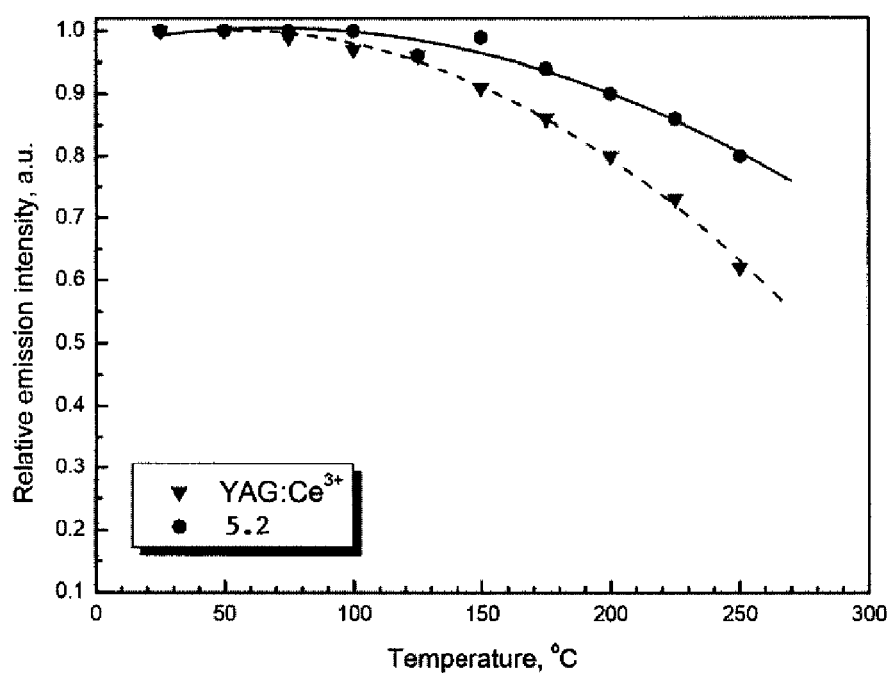
FIG. 30 depicts the temperature dependence of the emission intensity of $Ca_{1-x-z}M(I)_z(AlB)_{x-xy-z}Si_{1-x+xy+z}N_{2-x-xy-2w/3-v/3}O_wC_{xy}H_v:Ce^{3+}, M(I)^+$ (x=0.5, v=0, Ce=1 mol %, M(I)=Li).

The appropriate amounts of $Ca_3N_2$ and/or $CaSi_2$, AlN, BN, $Si_3N_4$, CeN or $CeO_2$, SiC, $Li_3N$ and alkali metal (Li, Na, K) or alkali metal silicide $M(I)_2Si$ (M(I)=Li, Na, K) were weighed out according to the designed ratio as shown in Table 17. Apart from SiC, the source of C can also be introduced by the starting materials of $MC_2$ (M=Ca, Sr, Ba, Eu), $Al_4C_3$ and $B_4C$. Subsequently, the powder mixture was mixed throughout by using a mortar and pestle under the protection of $N_2$ atmosphere. The mixture was then loaded in a firing boat/crucible and was fired at 1600° C. for 6 hours under $N_2/H_2$ atmosphere. The product powder was then ground and sieved for obtaining the phosphor with suitable particle size. The formulation of the final product was $Ca_{1-x-z}M(I)_z(AlB)_{x-xy-z}Si_{1-x+xy+z}N_{2-x-xy-2w/3-v/3}O_wC_{xy}H_v:Ce^{3+},M(I)^+$ (v=0). This phosphor emits a yellow-orange light under blue or nUV light excitation with high thermal stability and high quantum efficiency of luminescent emission. The excitation and emission spectra of the phosphors from this preparation are shown in FIGS. 27(a) and (b). The reflectance spectra of these phosphors are shown in FIG. 28. The XRD patterns are shown in FIG. 29, and the powder index data indicate that $Ce^{3+}$-doped carbidonitride phosphors belong to orthorhombic or monoclinic systems as mentioned in the above examples. FIG. 30 shows the temperature dependence of the emission intensity of one of the phosphors from this preparations, demonstrating a thermal stability of the emission better than that of YAG:Ce.

TABLE 19

Starting materials (grams) and luminescence characteristics for Ce³⁺-doped carbidonitride phosphors

| | $Ca_{1-x-z}M(I)_z(AlB)_{x-xy-z}Si_{1-x+xy+z}N_{2-x-xy-2w/3-v/3}O_wC_{xy}H_v$: | | | | | | | Luminescence Characteristics | | |
|---|---|---|---|---|---|---|---|---|---|---|
| Sample | | | | $Ce^{3+}$, $M(I)^+$ (v = 0) | | | | QE, | $\lambda_{em}$, | FWHM, |
| ID | $Ca_3N_2$ | AlN | $Si_3N_4$ | BN | Na/Li$_3$N | $CeO_2$ | SiC | $SiO_2$ | % | nm | nm |
| 5.1 | 0.7740 | 1.0678 | 0.0272 | 0.0252 | 0.0378 | 0.0440 | 0.7740 | 0 | 26 | 586 | 130 |
| 5.2 | 1.0188 | 0.8181 | 1.0564 | 0.0000 | 0.0127 | 0.0378 | 0.0440 | 1.0188 | 45 | 577 | 133 |

We claim:

1. A phosphor having the formula $Ca_{1-x-z}Na_zM(III)_{x-xy-z}Si_{1-x+xy+z}N_{2-x-xy}C_{xy}$:A, wherein 0.43<(1−x−z)<0.53; wherein 0.024<z≦0.05; wherein 0.36≦(x−xy−z)<0.53; wherein (1−x+xy+z)=0.6; wherein 1.3<(2−x−xy)<1.62; and, wherein 0.013<xy≦0.096; wherein M(III) is Al; and; wherein A is Eu²⁺.

2. The phosphor of claim 1, wherein the phosphor has the formula $Ca_{0.47}Na_{0.025}Al_{0.35}B_{0.025}Si_{0.6}N_{1.425}C_{0.075}$:Eu²⁺.

3. A phosphor having the formula $M(II)_{1-x-z}M(I)_zM(III)_{x-xy-z}Si_{1-x+xy+z}N_{2-x-xy}C_{xy}$:A wherein 0.3<x<0.8; 0<y<0.5; 0<z<0.45; (x+z)<1; x>(xy+z); 0<(x−xy−z)<1; M(II) is at least one divalent cation; M(I) is at least one monovalent cation; M(III) is at least one trivalent cation; and A is a luminescence activator.

4. A light emitting device comprising:
a light source which emits light having a first luminescence spectrum; and
a first phosphor which, upon irradiation with light from the light source, emits light having a second luminescence spectrum that is different than the first luminescence spectrum;
wherein the first phosphor comprises a phosphor having the formula $M(II)_{1-x-z}M(I)_zM(III)_{x-xy-z}Si_{1-x+xy+z}N_{2-x-xy}C_{xy}$:A wherein 0.3<x<0.8; 0<y<0.5; 0<z<0.45; (x+z)<1; x>(xy+z); 0<(x−xy−z)<1; M(II) is at least one divalent cation; M(I) is at least one monovalent cation; M(III) is at least one trivalent cation; and A is a luminescence activator.

5. The light emitting device of claim 4, wherein the first phosphor comprises a phosphor having the formula $Ca_{1-x-z}Na_zM(III)_{x-xy-z}Si_{1-x+xy+z}N_{2-x-xy}C_{xy}$:A, wherein 0.43<(1−x−z)<0.53; wherein 0.024<z≦0.05; wherein 0.36≦(x−xy−z)<0.53; wherein (1−x+xy+z)=0.6; wherein 1.3<(2−x−xy)<1.62; and, wherein 0.013<xy≦0.096; wherein M(III) is Al; and; wherein A is Eu²⁺.

6. The light emitting device of claim 4, wherein the first phosphor comprises a phosphor having the formula $Ca_{0.47}Na_{0.025}Al_{0.35}B_{0.025}Si_{0.6}N_{1.425}C_{0.075}$:Eu²⁺.

7. The phosphor of claim 1, wherein A is doped in the host crystal of the phosphor at a concentration level of about 0.001 mol % to about 10 mol % relative to Ca.

8. The phosphor of claim 1, wherein the crystal structure of the host crystal of the phosphor is an orthorhombic or monoclinic crystal system.

9. The phosphor of claim 1, wherein the crystal structure of the host crystal of the phosphor belongs to space group Cmc2₁ or Cc.

10. The phosphor of claim 1, wherein the crystal structure of the host crystal of the phosphor is an orthorhombic system; wherein the unit cell parameter a of the host crystal is between about 9.65 Å and about 9.90 Å; wherein the unit cell parameter b of the host crystal is between about 5.55 Å and about 5.80 Å; and wherein the unit cell parameter c of the host crystal is between about 5.000 Å and about 5.15 Å.

11. The phosphor of claim 1, wherein the crystal structure of the host crystal of the phosphor is a monoclinic system; wherein the unit cell parameter a of the host crystal is between about 9.65 Å and about 9.90 Å; wherein the unit cell parameter b of the host crystal is between about 5.55 Å and about 5.80 Å; wherein the unit cell parameter c of the host crystal is between about 5.000 Å and about 5.15 Å; and, wherein the unit cell parameter β (beta) of the host crystal is between about 87 degrees and about 93 degrees.

12. The phosphor of claim 2, wherein
M(II) is selected from the group consisting of Be, Mg, Ca, Sr, Ba, Cu, Co, Ni, Pd, Zn, and Cd;
M(I) is selected from the group consisting of Li, Na, K, Rb, Cu, Ag and Au;
M(III) is selected from the group consisting of B, Al, Ga, In, Sc, Y, La and Gd;
H is selected from the group consisting of F, Cl, Br and I; and
A comprises at least one metal ion selected from the group consisting of Ce, Pr, Nd, Sm, Eu, Gd, Tb, Dy, Ho, Er, Tm, Yb, Lu, Mn, Bi, and Sb.

13. The phosphor of claim 2, wherein A is doped in the host crystal of the phosphor at a concentration level of about 0.001 mol % to about 10 mol % relative to M(II).

14. The phosphor of claim 2, wherein the crystal structure of the host crystal of the phosphor is an orthorhombic or monoclinic crystal system.

15. The light emitting device of claim 3, wherein:
M(II) is selected from the group consisting of Be, Mg, Ca, Sr, Ba, Cu, Co, Ni, Pd, Zn, and Cd;
M(I) is selected from the group consisting of Li, Na, K, Rb, Cu, Ag and Au;
M(III) is selected from the group consisting of B, Al, Ga, In, Sc, Y, La and Gd;
H is selected from the group consisting of F, Cl, Br and I; and
A comprises at least one metal ion selected from the group consisting of Ce, Pr, Nd, Sm, Eu, Gd, Tb, Dy, Ho, Er, Tm, Yb, Lu, Mn, Bi, and Sb.

16. The light emitting device of claim 3, wherein the first luminescence spectrum is from about 330 nm to about 500 nm.

17. The light emitting device of claim 3, wherein the light source is a light emitting diode or a laser diode.

18. The light emitting device of claim 3, further comprising a second phosphor.

19. The light emitting device of claim 18, wherein the second phosphor comprises one or more of the following phosphors: a red-emitting phosphor, a blue-emitting phosphor, a yellow-emitting phosphor, and a green-emitting phosphor.

20. The light emitting device of claim 18, wherein the second phosphor is a green-emitting phosphor or a yellow-emitting phosphor.

21. The light emitting device of claim 18, wherein the second phosphor is a YAG:Ce phosphor, a green or yellow silicate phosphor, or a green sulfide phosphor.

22. The light emitting device of claim 3, further comprising at least two additional phosphors, wherein said at least two additional phosphors each comprise one or more of the following phosphors: a red-emitting phosphor, a blue-emitting phosphor, a yellow-emitting phosphor, and a green-emitting phosphor.

23. The light emitting device of claim 3, wherein the light emitting device emits white light.

24. The light emitting device of claim 18, wherein the light emitting device emits white light.

25. The light emitting device of claim 23, wherein the light emitting device emits warm or cool white light.

26. The light emitting device of claim 24, wherein the light emitting device emits warm or cool white light.

* * * * *